(12) United States Patent
Liang et al.

(10) Patent No.: US 10,771,893 B1
(45) Date of Patent: Sep. 8, 2020

(54) SOUND PRODUCING APPARATUS

(71) Applicant: xMEMS Labs, Inc., Los Altos, CA (US)

(72) Inventors: Jemm Yue Liang, Sunnyvale, CA (US); Wen-Chien Chen, New Taipei (TW)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 16/882,554

(22) Filed: May 25, 2020

Related U.S. Application Data

(60) Provisional application No. 62/913,175, filed on Oct. 10, 2019.

(51) Int. Cl.
*H04R 3/00* (2006.01)
*H03F 3/20* (2006.01)
*H03F 1/02* (2006.01)
*H04R 7/04* (2006.01)
*H04R 17/00* (2006.01)

(52) U.S. Cl.
CPC ............. *H04R 3/00* (2013.01); *H03F 1/02* (2013.01); *H03F 3/20* (2013.01); *H04R 7/04* (2013.01); *H04R 17/00* (2013.01); *H03F 2200/03* (2013.01); *H03F 2200/102* (2013.01)

(58) Field of Classification Search
CPC . H04R 1/005; H04R 3/00; H04R 3/04; H04R 3/08; H04R 9/00; H04R 9/06; H04R 9/063; H04R 11/00; H04R 11/02; H04R 2201/03; H03F 1/02; H03F 7/04; H03F 2200/03; H03F 2200/102

USPC .......... 381/111, 117, 98, 190, 191; 310/334; 367/137, 138
See application file for complete search history.

(56) References Cited

U.S. PATENT DOCUMENTS

| | | | | |
|---|---|---|---|---|
| 3,879,699 | A * | 4/1975 | Pepper | B06B 1/0611 367/137 |
| 8,861,752 | B2 * | 10/2014 | Margalit | H04R 31/00 381/152 |
| 9,571,938 | B2 * | 2/2017 | Schelling | H04R 19/005 |
| 10,284,961 | B2 * | 5/2019 | Margalit | H04R 7/10 |
| 10,327,060 | B2 * | 6/2019 | Lo | H04M 1/6058 |
| 10,425,732 | B1 * | 9/2019 | Liang | H04R 3/04 |
| 10,484,784 | B1 * | 11/2019 | Liang | H04R 7/04 |
| 10,536,770 | B1 * | 1/2020 | Liang | G10K 9/13 |
| 10,547,952 | B1 * | 1/2020 | Liang | H04R 1/28 |
| 10,681,488 | B1 * | 6/2020 | Liang | H04S 3/008 |
| 2016/0088418 | A1 * | 3/2016 | Sato | H04S 7/305 381/17 |

(Continued)

*Primary Examiner* — Xu Mei
(74) *Attorney, Agent, or Firm* — Winston Hsu

(57) ABSTRACT

A sound producing apparatus is provided. The sound producing apparatus includes a driving circuit, configured to generate a driving signal according to an input audio signal; and a sound producing device; wherein the sound producing device is driven by the driving signal, such that the sound producing device produces a plurality of air pulses at an air pulse rate, the air pulse rate is higher than a maximum human audible frequency; wherein the plurality of air pulses produces a non-zero offset in terms of sound pressure level, and the non-zero offset is a deviation from a zero sound pressure level; wherein the driving signal driving the sound producing device to produce the plurality of air pulses, is unipolar with respect to a first voltage.

22 Claims, 16 Drawing Sheets

(56) References Cited

U.S. PATENT DOCUMENTS

2016/0381464 A1* 12/2016 Elyada .................. H04R 19/02
 381/97
2019/0313190 A1* 10/2019 Liang ..................... H04R 1/025

* cited by examiner

SOUND PRODUCING APPARATUS

CROSS REFERENCE TO RELATED APPLICATIONS

This application claims the benefit of—U.S. provisional application No. 62/913,175, filed on Oct. 10, 2019, which is incorporated herein by reference.

BACKGROUND OF THE INVENTION

1. Field of the Invention

The present application relates to a sound producing apparatus, and more particularly, to a sound producing apparatus capable of enhancing sound pressure level.

2. Description of the Prior Art

Speaker driver is always the most difficult challenge for high-fidelity sound reproduction in the speaker industry. The physics of sound wave propagation teaches that, within the human audible frequency range, the sound pressures generated by accelerating a membrane of a conventional speaker drive may be expressed as $P \propto SF \cdot AR$, where $SF$ is the membrane surface area and $AR$ is the acceleration of the membrane. Namely, the sound pressure $P$ is proportional to the product of the membrane surface area $SF$ and the acceleration of the membrane $AR$. In addition, the membrane displacement $DP$ may be expressed as $DP \propto \frac{1}{2} \cdot AR \cdot T^2 \propto 1/f^2$, where $T$ and $f$ are the period and the frequency of the sound wave respectively. The air volume movement $V_{A,CV}$ caused by the conventional speaker driver may then be expressed as $V_{A,CV} \propto SF \cdot DP$. For a specific speaker driver, where the membrane surface area is constant, the air movement $V_{A,CV}$ is proportional to $1/f^2$, i.e., $V_{A,CV} \propto 1/f^2$.

To cover a full range of human audible frequency, e.g., from 20 Hz to 20 KHz, tweeter(s), mid-range driver(s) and woofer(s) have to be incorporated within a conventional speaker. All these additional components would occupy large space of the conventional speaker and will also raise its production cost. Hence, one of the design challenges for the conventional speaker is the impossibility to use a single driver to cover the full range of human audible frequency.

Another design challenge for producing high-fidelity sound by the conventional speaker is its enclosure. The speaker enclosure is often used to contain the back-radiating wave of the produced sound to avoid cancelation of the front radiating wave in certain frequencies where the corresponding wavelengths of the sound are significantly larger than the speaker dimensions. The speaker enclosure can also be used to help improve, or reshape, the low-frequency response, for example, in a bass-reflex (ported box) type enclosure where the resulting port resonance is used to invert the phase of back-radiating wave and achieves an in-phase adding effect with the front-radiating wave around the port-chamber resonance frequency. On the other hand, in an acoustic suspension (closed box) type enclosure where the enclosure functions as a spring which forms a resonance circuit with the vibrating membrane. With properly selected speaker driver and enclosure parameters, the combined enclosure-driver resonance peaking can be leveraged to boost the output of sound around the resonance frequency and therefore improves the performance of resulting speaker.

Therefore, how to design a small sound producing apparatus/device while overcoming the design challenges faced by conventional speakers as stated above is an important objective in the field.

SUMMARY OF THE INVENTION

It is therefore a primary objective of the present application to provide a sound producing device and a sound producing device capable of producing sound at a pulse rate, where the pulse rate is higher than the maximum audible frequency.

An embodiment of the present application provides a sound producing apparatus. The sound producing apparatus comprises a driving circuit, configured to generate a driving signal according to an input audio signal; and a sound producing device; wherein the sound producing device is driven by the driving signal, such that the sound producing device produces a plurality of air pulses at an air pulse rate, the air pulse rate is higher than a maximum human audible frequency; wherein the plurality of air pulses produces a non-zero offset in terms of sound pressure level, and the non-zero offset is a deviation from a zero sound pressure level; wherein the driving signal driving the sound producing device to produce the plurality of air pulses, is unipolar with respect to a first voltage.

These and other objectives of the present application will no doubt become obvious to those of ordinary skill in the art after reading the following detailed description of the preferred embodiment that is illustrated in the various figures and drawings.

DETAILED DESCRIPTION

To overcome the design challenges of speaker driver and enclosure within the sound producing industry, Applicant provides the MEMS (micro-electrical-mechanical-system) sound producing device in U.S. application Ser. No. 16/125,761, so as to produce sound in a PAM-UPA (Ultrasonic Pulse Array with Pulse Amplitude Modulation) scheme, in which the sound is produced at an air pulse rate/frequency higher than the maximum (human) audible frequency. However, the sound producing device in U.S. application Ser. No. 16/125,761 requires valves. To achieve such fast pulse rate, the valves need to be able to perform open-and-close operation within roughly 2.6-3.90. The fast moving valves would need to endure dust, sweat, hand grease, ear wax, and be expected to survive over trillion cycles of operation, which are beyond challenging. To alleviate the endurance demanded by the device in U.S. application Ser. No. 16/125,761, Applicant provides the PAM-UPA driving scheme to drive conventional treble speaker in U.S. application Ser. No. 16/420,141, which is driven according to a PAM signal.

In the present application, a sound producing apparatus driven by a unipolar driving signal is provided. The sound producing apparatus driven by the unipolar driving signal would have improved performance in terms of SPL (sound pressure level) and/or SNR (signal-to-noise ratio) over the one in U.S. application Ser. No. 16/420,141.

Figure 1:
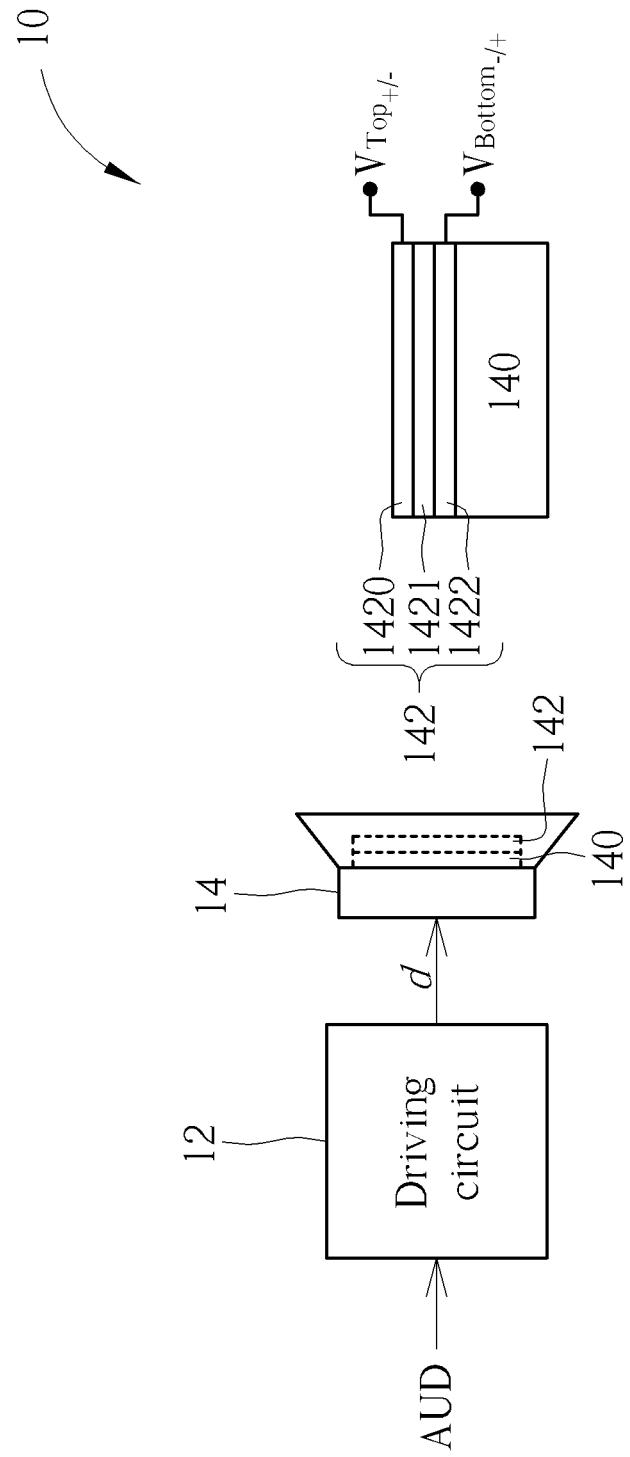
FIG. 1 is a schematic diagram of a sound producing apparatus according to an embodiment of the present application.

FIG. 1 is a schematic diagram of a sound producing apparatus 10 according to an embodiment of the present application. The sound producing apparatus 10 comprises a driving circuit 12 and a sound producing device 14. The driving circuit 12 is configured to generate a driving signal d according to an input/source audio signal AUD. The sound producing device 14 comprises a membrane 140 and an actuator 142 disposed on the membrane 142. The actuator 142 receives the driving signal d, such that the sound producing device 14 would produce a plurality of air pulses at an air pulse rate, where the air pulse rate is higher than a maximum human audible frequency.

In an embodiment, the actuator 142 may be a thin film actuator, e.g., a piezoelectric actuator or a nanoscopic electrostatic drive (NED) actuator, which comprises electrodes 1420, 1422 and a material 1421 (e.g. piezoelectric material). The electrode 1420 receives a top voltage $V_{Top}$ and the electrode 1422 receives a bottom voltage $V_{Bottom}$. The driving signal d is applied on/across the electrodes 1420 and 1422 to cause the (piezoelectric) material to deform.

Similar to U.S. application Ser. Nos. 16/125,761 and 16/420,141, the plurality of air pulses generated by the SPD 14 would have non-zero offset in terms of sound pressure level (SPL), where the non-zero offset is a deviation from a zero SPL. Also, the plurality of air pulses generated by the SPD 14 is aperiodic over a plurality of pulse cycles.

Figure 20:
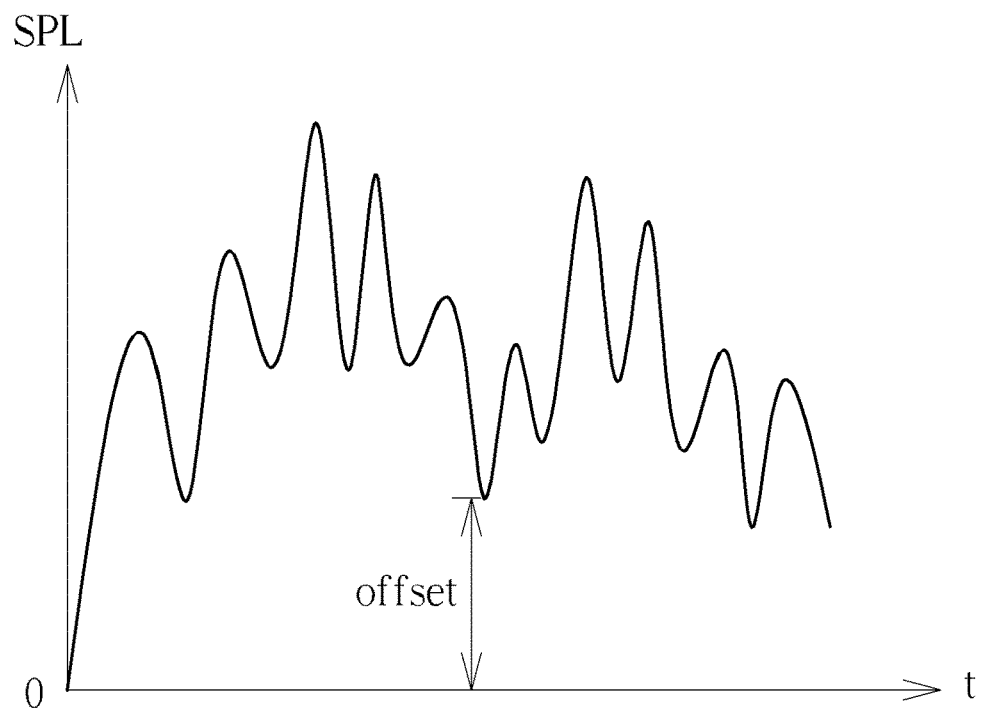
FIG. 20 illustrates a plurality of air pulses according to an embodiment of the present application.
Figure 21:
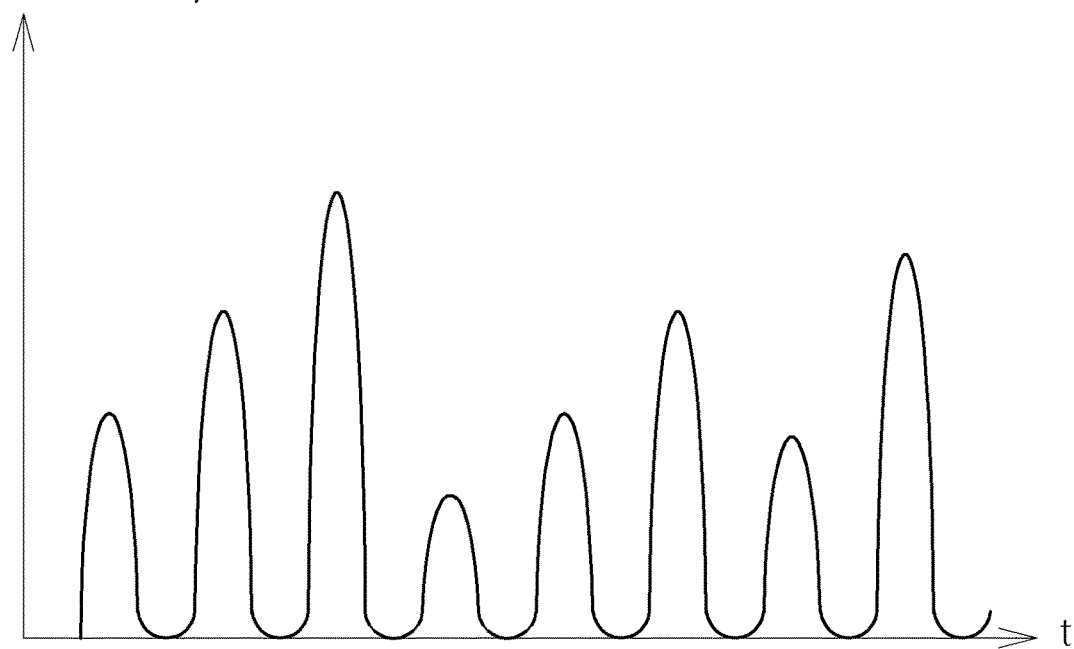
FIG. 21 illustrates a plurality of air pulses according to an embodiment of the present application.

For example, FIG. 20 illustrates a schematic diagram of a plurality of air pulses generated by the sound producing device 14 in terms of SPL. FIG. 21 illustrates a schematic diagram of a plurality of air pulses generated by the sound producing device 14 in terms of air mass velocity or membrane displacement, the displacement of membrane 140. As can be seen from FIG. 20, the plurality of air pulses produces a non-zero offset in terms of SPL, where the non-zero offset is a deviation from a zero sound pressure level. As can be seen from FIG. 21, the air mass velocity (or displacement of membrane 140) is aperiodic over 8 pulse cycles. Given sound pressure level (SPL) is a 2nd-order derivative of membrane movement with respect to time, the air pulses in terms of SPL would also be aperiodic over these 8 pulse cycles. Details of the "non-zero SPL offset" and the "aperiodicity" properties may be refer to U.S. application Ser. No. 16/125,761, which are not narrated herein for brevity.

Different from U.S. application Ser. No. 16/420,141, the driving signal d applied to the actuator 142 (to produce the plurality of air pulses) is unipolar with respect to a reference voltage $V_{REF}$. The reference voltage $V_{REF}$ may be a voltage within a specific range. In an embodiment, the reference voltage $V_{REF}$ may be a voltage corresponding to a neutral state (e.g., without deformation) of the membrane 140 or a little bit higher/lower than the voltage corresponding to the neutral state. In an embodiment, the reference voltage $V_{REF}$ may also be corresponding to a specific membrane displacement. In an embodiment, the reference voltage $V_{REF}$ corresponds to an operating voltage range producing low power consumption. In an embodiment, the reference voltage $V_{REF}$ may be a ground voltage or a constant voltage.

To elaborate more, for a unipolar signal with respect to a reference voltage/level, the unipolar signal is always greater than or equal to the reference voltage/level, or always less than or equal to the reference voltage/level. That is, the unipolar signal may attain the reference voltage/level, but the unipolar signal never crosses the reference voltage/level. In some context, the unipolar signal is also called as "single-ended" signal and the bipolar is also called as "double-ended" signal. In the present application, the single-ended signal and the unipolar signal share the same meaning and are used interchangeably.

Figure 2:
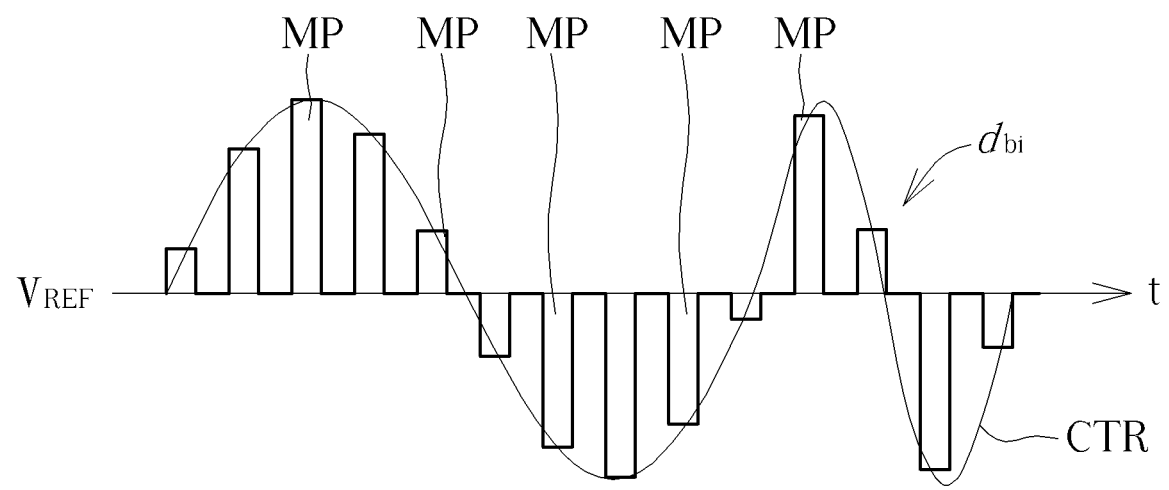
FIG. 2 is a schematic diagram of a plurality of signals according to an embodiment of the present application.
Figure 2:
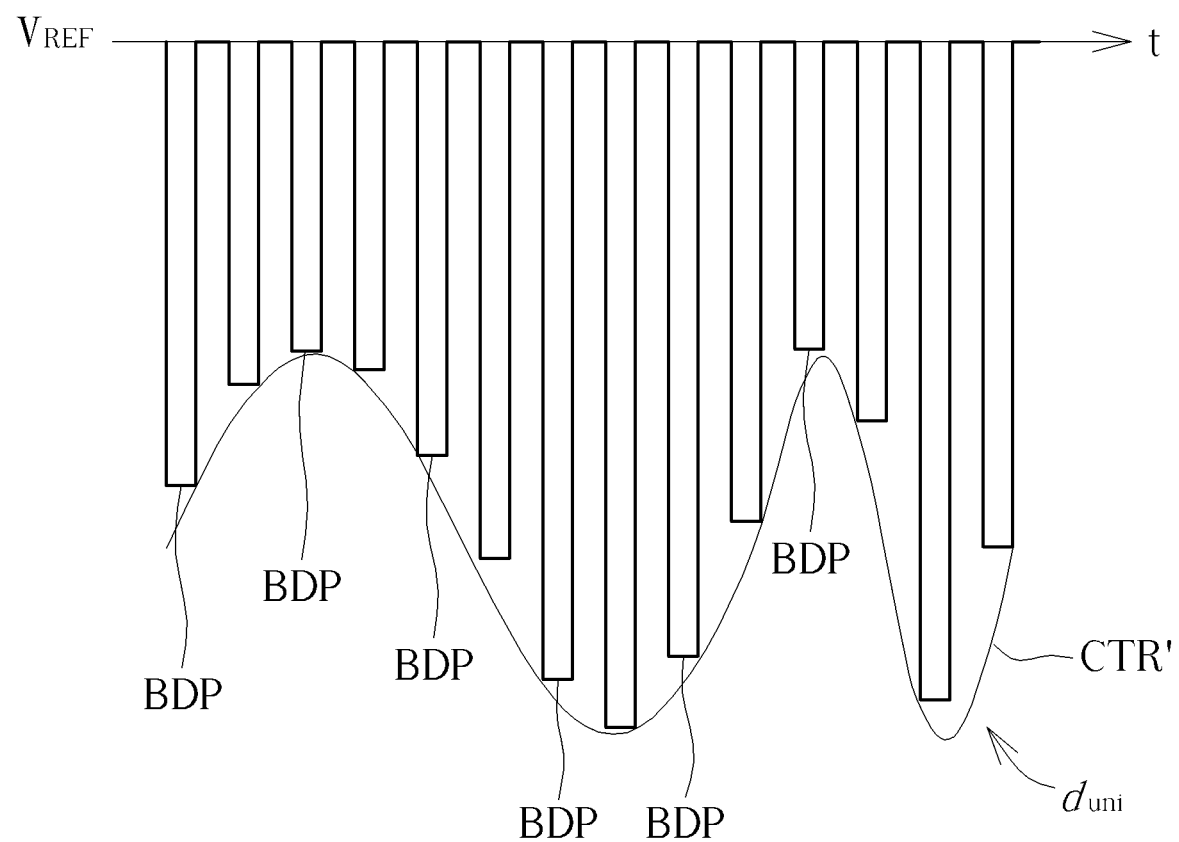

FIG. 2 illustrates a comparison between a bipolar signal $d_{bi}$ and a unipolar signal $d_{uni}$ with respect to the reference voltage $V_{REF}$. The bipolar signal $d_{bi}$ may comprise a plurality of pulses MP, and the unipolar signal $d_{uni}$ may comprise a plurality of pulses BDP. As can be seen from FIG. 2, some of the pulses MP within the bipolar signal $d_{bi}$ have positive polarity and some of the pulses MP have negative polarity. As for the pulses BDP, polarities of the pulses BDP are all negative. In addition, the pulses MP and the pulses BDP would follow a contour CTR and a contour CTR', respectively, where the contour CTR' is a translated version of the contour CTR. Simulations and actual measurements show that results of the unipolar driving signal could outperform which of the conventional driving scheme.

Figure 3:
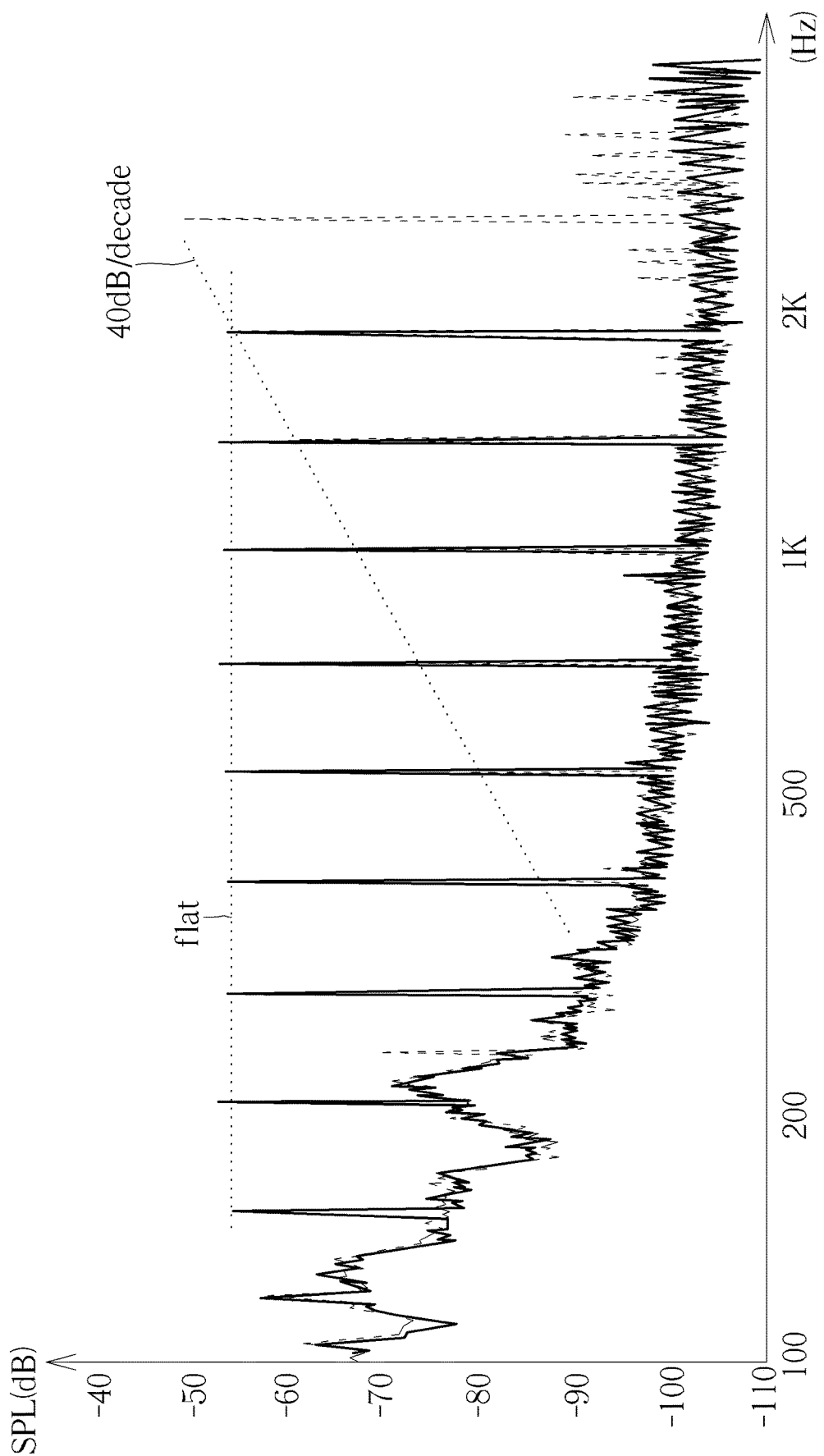
FIG. 3 is a schematic diagram of a spectrum analysis of an embodiment of the present application.

Measurement data in FIG. 3 illustrates spectrum analysis for the unipolar driving signal at the pulse rate (higher than the maximum audible frequency), represented by bold solid line, and the conventional driving scheme, represented by thin dashed line, where the conventional driving scheme is to drive the MEMS SPD at a sound frequency, or to drive the MEMS SPD directly by amplifying the input audio signal AUD to the sample magnitude as the unipolar driving signal, for example. In FIG. 3, the test signal (to simulate the input/source audio signal AUD) comprises 10 equal amplitude sinusoidal waves, from 152 Hz to 2544 Hz equally distributed in log scale. The microphone settings are the same for both cases (i.e., for the case of the unipolar driving signal and for the case of the conventional driving scheme). The solid line, and the horizontal dotted-line connecting the 10 SPL peaks, represents an output SPL result of using the unipolar driving signal (e.g., d) to drive a MEMS SPD (e.g., 14). The dashed line, and the slanted dotted-line connecting SPL peaks, represents an output SPL result of using the conventional scheme (e.g., the input audio signal AUD) to drive the same MEMS SPD.

From FIG. 3, it is not surprise that the SPL result of the conventional scheme decays nearly 40 dB/decade (2nd order) toward lower frequency. On the contrary, the SPL result of the unipolar driving signal remains flat toward low frequency. As can be seen, the SPL performance is significantly enhanced by using the unipolar driving signal, especially toward the low audio frequency. Also, harmonic distortion or noise energy of the unipolar driving signal is lower than the one of the conventional scheme, especially at frequency above 2 KHz. Thus, SNR (signal-to-noise ratio) is also improved by using the unipolar driving signal.

Figure 22:
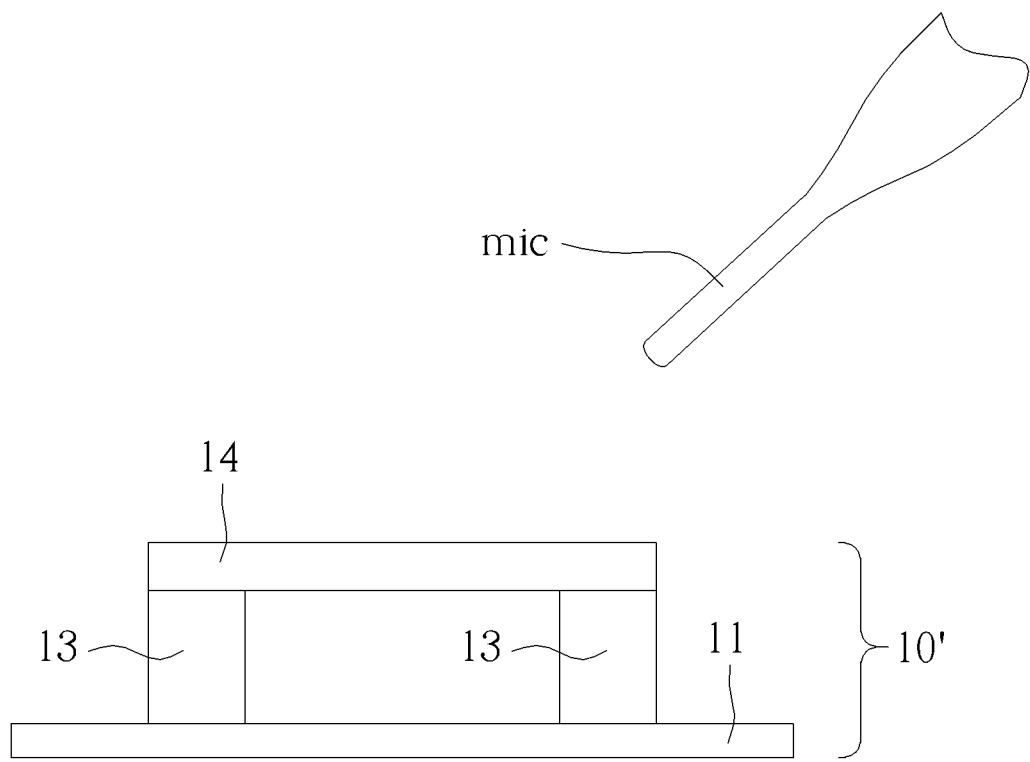
FIG. 22 illustrates an experiment scenario of a sound producing apparatus according to an embodiment of the present application.
Figure 23:
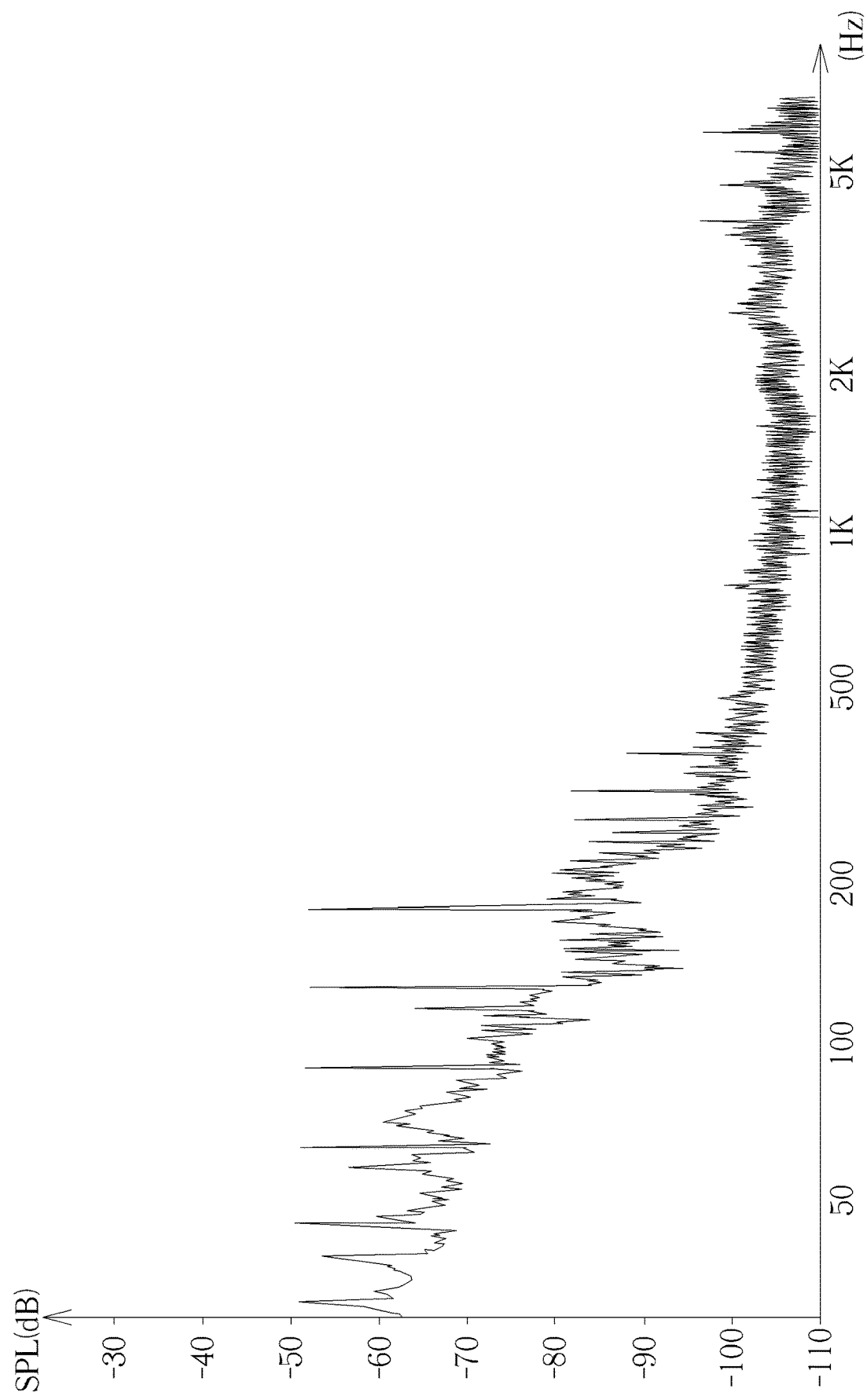
FIG. 23 is a schematic diagram of a spectrum analysis of an embodiment of the present application.

Furthermore, FIG. 22 illustrates an experiment scenario measuring SPL of a sound producing apparatus 10' driven by the unipolar driving signal d. FIG. 23 illustrates a spectrum analysis of the sound producing apparatus of FIG. 22. The sound producing apparatus 10' is an experiment test circuit board of the sound producing apparatus 10. The sound producing apparatus 10', comprising a docking circuit board 11, connectors 13 and the SPD 14 mounted on a COB (chip-on-board, which is also annotated as 14 herein), is in an open-baffle type configuration without back enclosure. The surface of COB 14, which corresponds to the baffle of an open-baffle speaker, has an area of 3 cm×1.5 cm. The driving circuit is omitted in FIG. 22 for brevity. A microphone, denoted as "mic", is at about 45° off-axis above the SPD 14 to measure the sound produced by the sound producing apparatus 10'. The test signal in FIG. 23 comprises 5 equal-amplitude tones evenly distributed over the band of 30 Hz to 200 Hz.

As can be seen from FIG. 23, the SPL spectrum of the sound producing apparatus 10' (driven by the unipolar driving signal d) is able to extend down to 32 Hz while maintaining flat frequency response. Note that, the conventional open-baffle speaker requires baffle with sufficient size, where the size is related to the wavelength corresponding to the lower-bound of audio frequency the apparatus intended to produced, which may be tens of centimeters for mid-range speakers or even meters for woofers. Compared to the conventional open-baffle speaker, the surface area of COB 14 in sound producing apparatus 10' (driven by the unipolar driving signal d) is reduced drastically. Furthermore, the size of the baffle 11 is shown to be independent of the intended low audio frequency.

Figure 4:
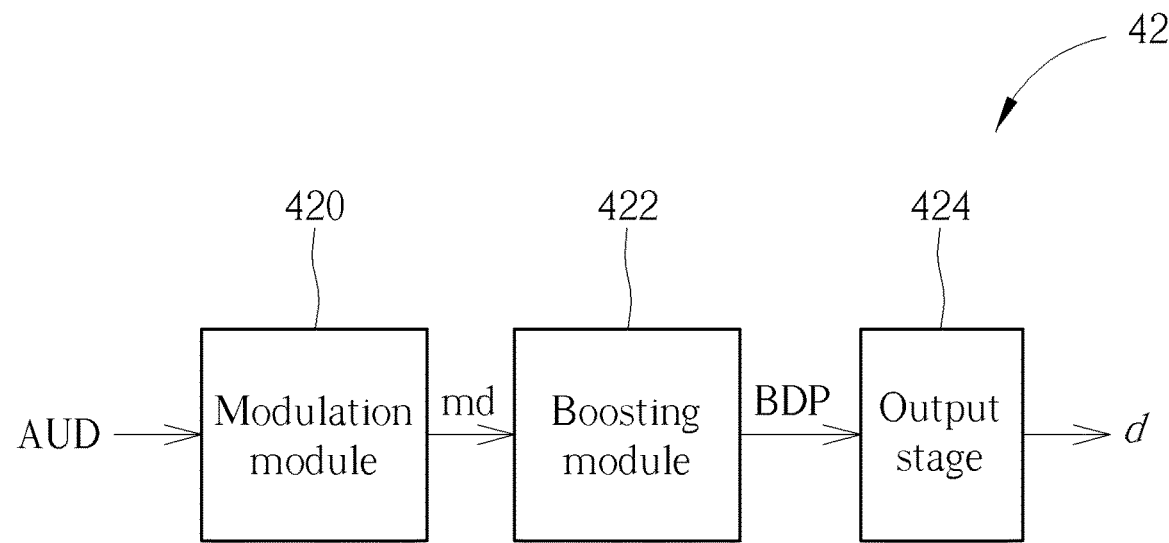
FIG. 4 is a schematic diagram of a driving circuit according to an embodiment of the present application.

Details of the driving circuit 12 generating the unipolar driving signal d are not limited. For example, FIG. 4 is a schematic diagram of a driving circuit 42 according to an embodiment of the present application. The driving circuit 42 may be used to realize the driving circuit 12. The driving circuit 42 comprises a modulation module 420 and a boosting module 422. The modulation module 420 is configured to generate a modulated (e.g., pulse amplitude modulated) signal md according to the input audio signal AUD. The boosting module 422 is configured to boost the modulated signal md, such that the driving signal d, generated according to an output of the boosting module 422, is unipolar.

Details of the modulation module 420 may be referred to U.S. application Ser. No. 16/420,141, which is not narrated herein for brevity. The modulated signal md comprises a plurality of modulated pulses, which is usually bipolar. The boosting module 422 is configured to generate a plurality of boosted pulses (i.e., the output of the boosting module 422) according to the plurality of modulated pulses.

In FIG. 4, the driving circuit 42 firstly generates the modulated signal md and then boost the modulated signal md, which is not limited thereto. The driving circuit of the present application may boost/offset the original input audio signal AUD by a certain level, such that the boosted/offset version of input audio signal (denoted as AUD') is unipolar. Then, the driving circuit may perform PAM on the boosted/offset version of input audio signal AUD', so as to generate the unipolar driving signal d.

Referring back to FIG. 2, the pulses MP may be viewed as an illustration of the plurality of modulated pulses, which is bipolar; while the pulses BDP may be viewed as an illustration of the plurality of boosted pulses, which is unipolar. The driving circuit 42 may generate the driving signal d according to the plurality of boosted pulses BDP generated by the boosting module 422.

Details of the boosting module 422 generating the boosted pulses BDP are not limited. In an embodiment, the boosting module 422 may generate a plurality of boosting pulses BNP, and add the plurality of boosting pulses BNP directly on the plurality of modulated pulses MP, to generate the plurality of boosted pulses BDP.

Figure 5:
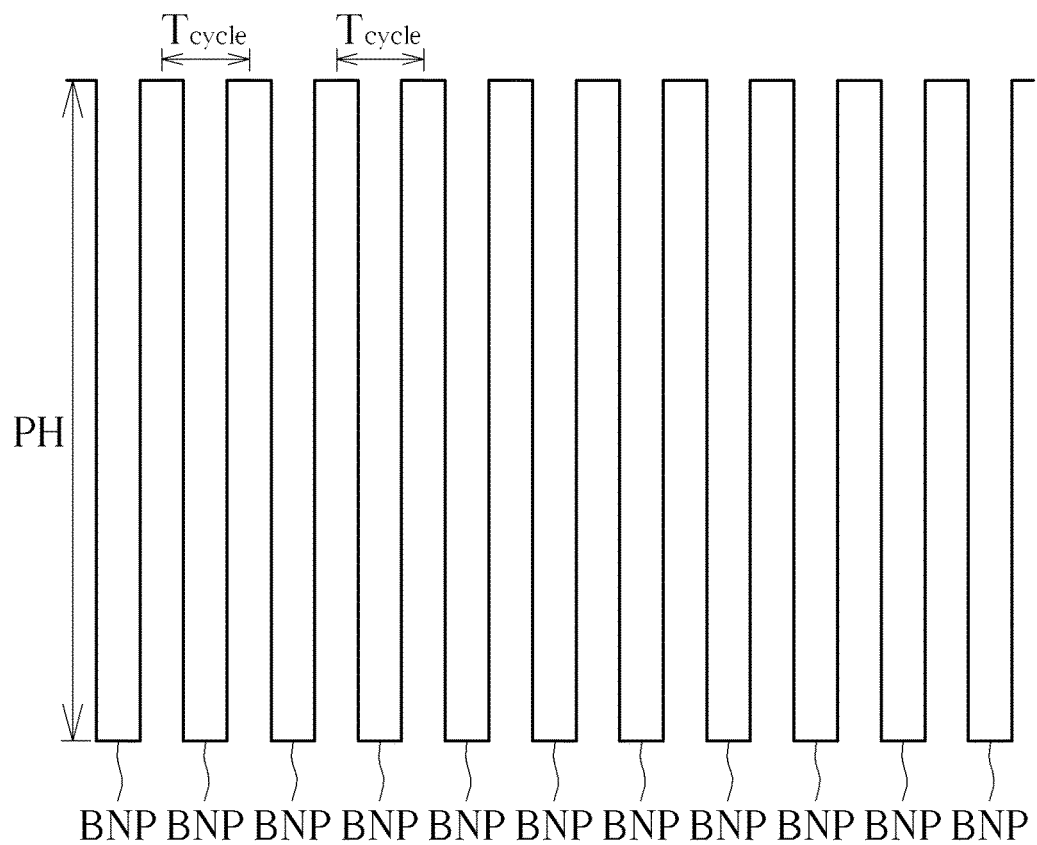
FIG. 5 is a schematic diagram of boosting pulses according to an embodiment of the present application.

In an embodiment, the plurality of boosting pulses BNP may have a constant pulse height over a plurality of pulse cycles. For example, FIG. 5 is a schematic diagram of the boosting pulses BNP according to an embodiment of the present application. The boosting pulses BNP are all with negative polarity and have a constant pulse height PH over a plurality of pulse cycles $T_{cycle}$. The pulse height PH of an electric pulse may be a voltage difference within the pulse cycle $T_{cycle}$, i.e., the difference between a minimum and a maximum within the pulse cycle $T_{cycle}$. The boosting module 422 may add the plurality of boosting pulses BNP (illustrated in FIG. 5) directly on the plurality of modulated pulses MP (illustrated in upper portion of FIG. 2), so as to generate the plurality of boosted pulses BDP (illustrated in lower portion of FIG. 2).

In addition, the driving circuit 42 may comprise an output stage 424 coupled to the boosting module 422. The output stage 424 may comprise a power amplifier, for example. The output stage 424 is configured to generate the driving signal d according to the plurality of boosted pulses BDP.

Notably, the thin film actuator 142 may be viewed as capacitive loading with capacitance in the range of 30 nF to 0.7 g. Driving the sound producing device 14 using the boosted voltage pulses BDP having such large loading capacitance would result in high power consumption. To save power, the driving circuit 12 may reduce the pulse voltage swings.

Figure 6:
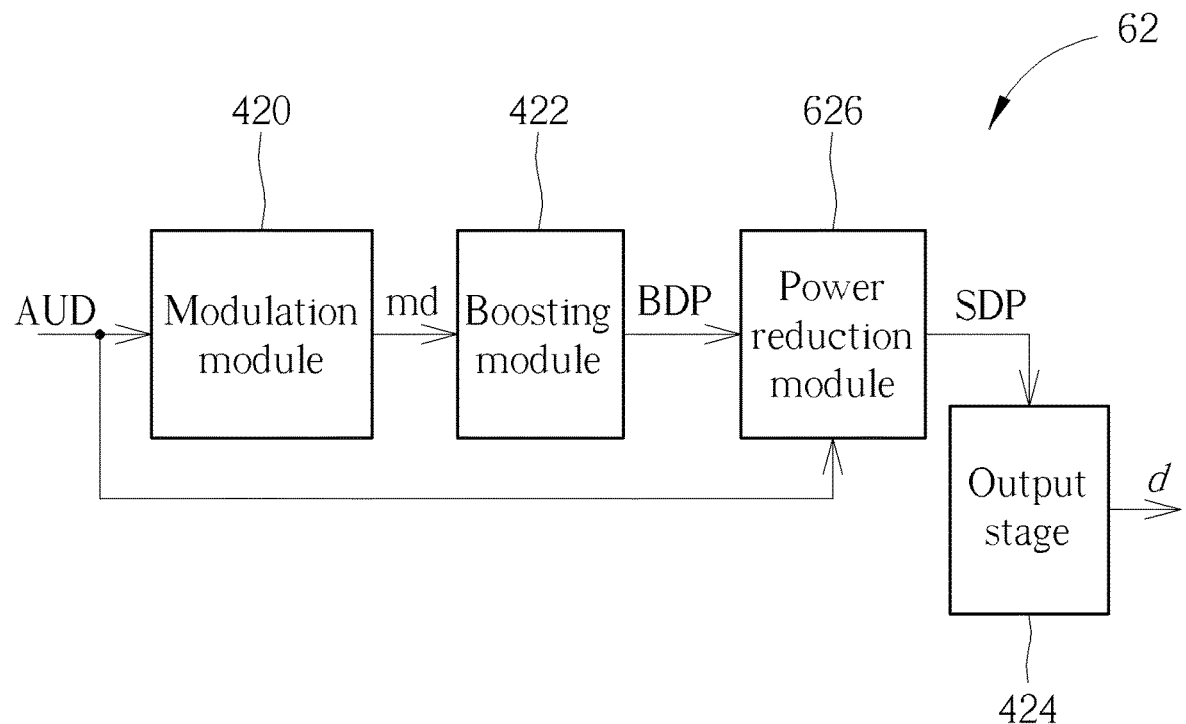
FIG. 6 is a schematic diagram of a driving circuit according to an embodiment of the present application.

FIG. 6 is a schematic diagram of a driving circuit 62 according to an embodiment of the present application. The driving circuit 62 may be used to realize the driving circuit 12. The driving circuit 62 is similar to the driving circuit 42, and thus, same components are annotated by the same symbols. Different from the driving circuit 42, the driving circuit 62 further comprises a power reduction module 626.

The power reduction module 626, receiving the input audio signal AUD, is coupled to the boosting module 422. The power reduction module 626 is configured to alleviate a power consumption which is consumed by the plurality of boosted pulses BDP, so as to generate a plurality of swing-deducted pulses SDP according to the plurality of boosted pulses BDP, such that the driving circuit 62 can generate the driving signal d according to the plurality of swing-deducted pulses SDP, via, e.g., the output stage 424.

Figure 7:
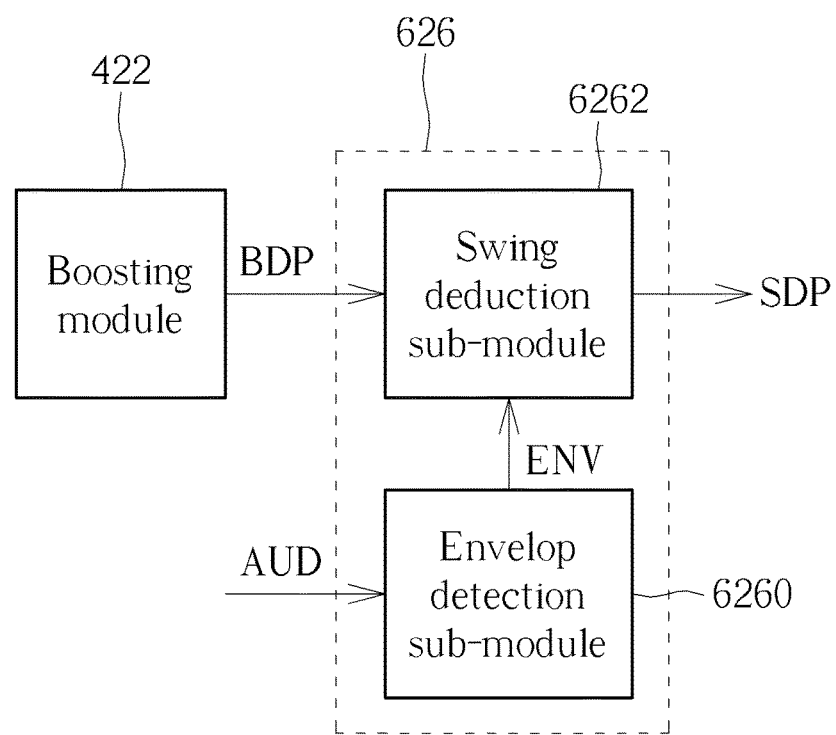
FIG. 7 is a schematic diagram of a power reduction module according to an embodiment of the present application.

FIG. 7 is a schematic diagram of the power reduction module 626 according to an embodiment of the present application. The power reduction module 626 comprises an envelope detection sub-module 6260 and a swing deduction sub-module 6262. The envelope detection sub-module 6260 receives the input audio signal AUD and is configured to extract an envelope ENV (e.g., a one-sided envelope) of the input audio signal AUD, such that the swing deduction sub-module 6262 generates the swing-deducted pulses SDP according to the envelope ENV.

Figure 8:
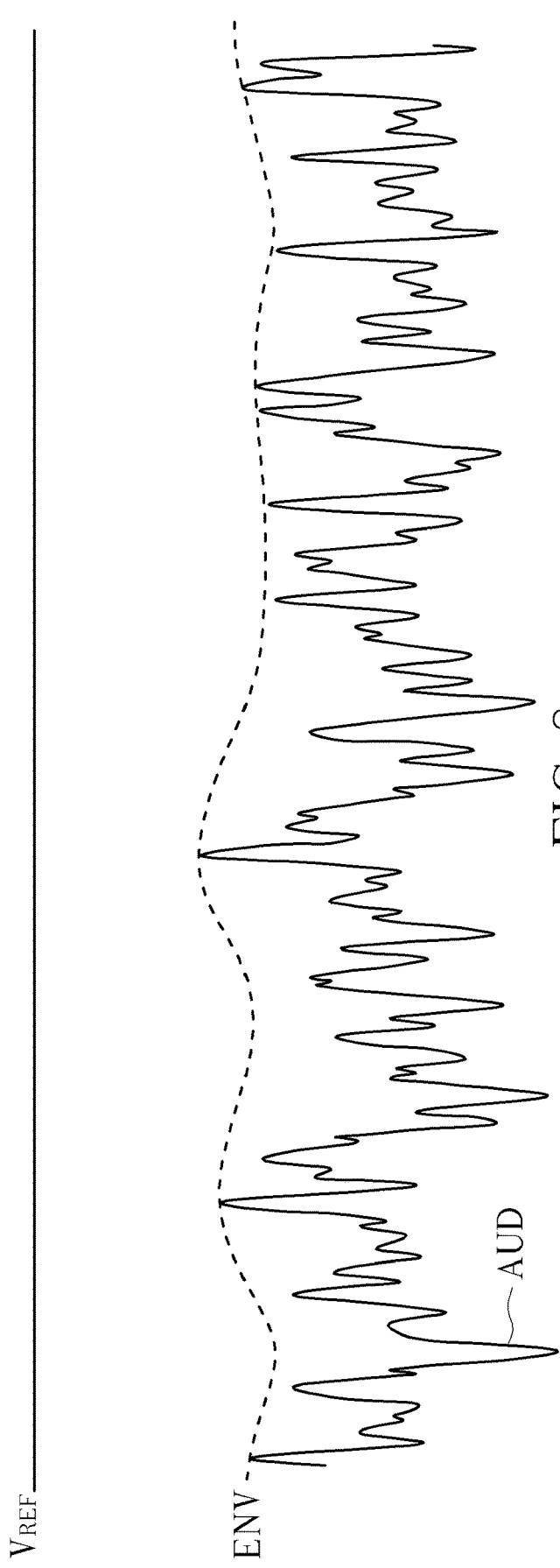
FIG. 8 provides an illustration of an input audio signal and its corresponding envelope.

For example, FIG. 8 provides an illustration of an input audio signal AUD and its corresponding envelope ENV. As can be seen from FIG. 8, the envelope detection sub-module 6260 is able to generate the envelope ENV according to the input audio signal AUD.

Figure 9:
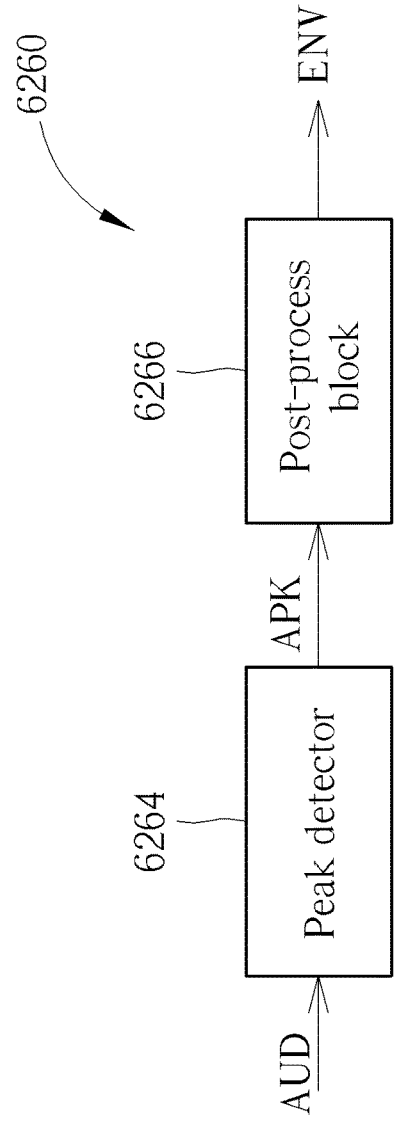
FIG. 9 is a schematic diagram of an envelope detection sub-module according to an embodiment of the present application.
Figure 10:
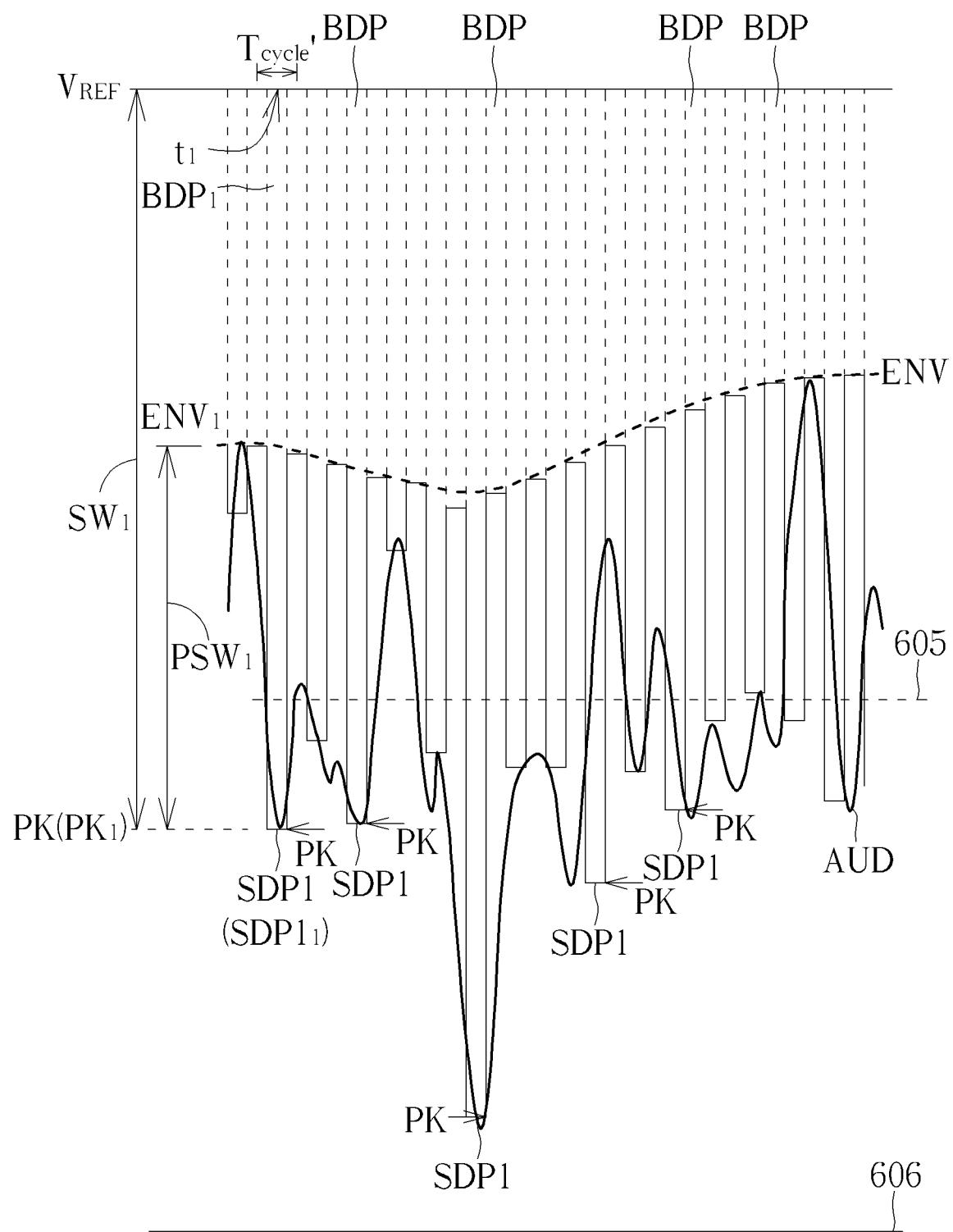
FIG. 10 provides an illustration of a plurality of boosted pulses, a plurality of swing-deducted pulses, an input audio signal and its corresponding envelope.

FIG. 9 is a schematic diagram of the envelope detection sub-module 6260 according to an embodiment of the present application. The envelope detection sub-module 6260 may comprise a peak detector 6264 and a post-processing block 6266. The peak detector 6264 is configured to obtain peaks APK of the input audio signal AUD. The post-processing block 6266 may perform a low pass filtering operation on the peaks APK of the input audio signal AUD, and/or utilize an attack-and-release control algorithm, which is commonly practiced in the field of acoustic effect manipulation, to generate the envelope ENV. After the envelope ENV is obtained, the swing deduction sub-module 6262 is configured to generate the plurality of swing-deducted pulses SDP according to the plurality of boosted pulses BDP and the envelope ENV FIG. 10 provides an illustration (a small portion of FIG. 8) of a plurality of boosted pulses BDP, a plurality of swing-deducted pulses SDP1, an input audio signal AUD and its corresponding envelope ENV. In FIG. 10, lower portion of the boosted pulses BDP, beyond (below) the envelope ENV, are overlapped with the swing-deducted pulses SDP1, which is illustrated in solid line. Upper portions of the boosted pulses BDP swinging between the reference voltage $V_{REF}$ and the envelope ENV are illustrated in dashed line. The swing-deducted pulses SDP1 are pulses swinging between the envelope ENV and peaks PK of the boosted pulses BDP. That is, the swing-deducted pulses SDP1 initiate from envelope values corresponding to different times and swing toward the peaks PK of the boosted pulse BDP, such that the voltage swing of pulses (or the driving signal d) is deducted.

In other words, the swing deduction sub-module 6262 deducts a swing SW of a boosted pulse BDP to generate a swing-deducted pulse SDP1 according to the envelope ENV. The voltage swing SW of the boosted pulse BDP is a difference between the reference voltage $V_{REF}$ and a peak PK of the boosted pulse BDP, i.e., $SW=|PK-V_{REF}|$. Specifically, the swing deduction sub-module 6262 may generate a swing-deducted pulse $SDP1_1$, such that the swing-deducted pulse $SDP1_1$ initiates at an envelope value $ENV_1$ of the envelope ENV corresponding to a time $t_1$ and reaches a peak $PK_1$ of a boosted pulse $BDP_1$ within a pulse cycle $T_{cycle,1}$ corresponding to the time $t_1$ and $ENV_1+PSW_1=PK_1$.

A voltage swing of swing-deducted pulses SDP (within the pulse cycle $T_{cycle,1}$), may be deducted to a pulse swing $PSW_1$, where $PSW_1=|PK_1-ENV_1|$, a difference between the first envelope value $ENV_1$ and the peak $PK_1$. Note that, $PSW_1=|PK_1-ENV_1|<SW_1=|PK_1-V_{REF}|$, as illustrated in FIG. 10, and therefore pulse swing is effectively reduced.

Figure 11:
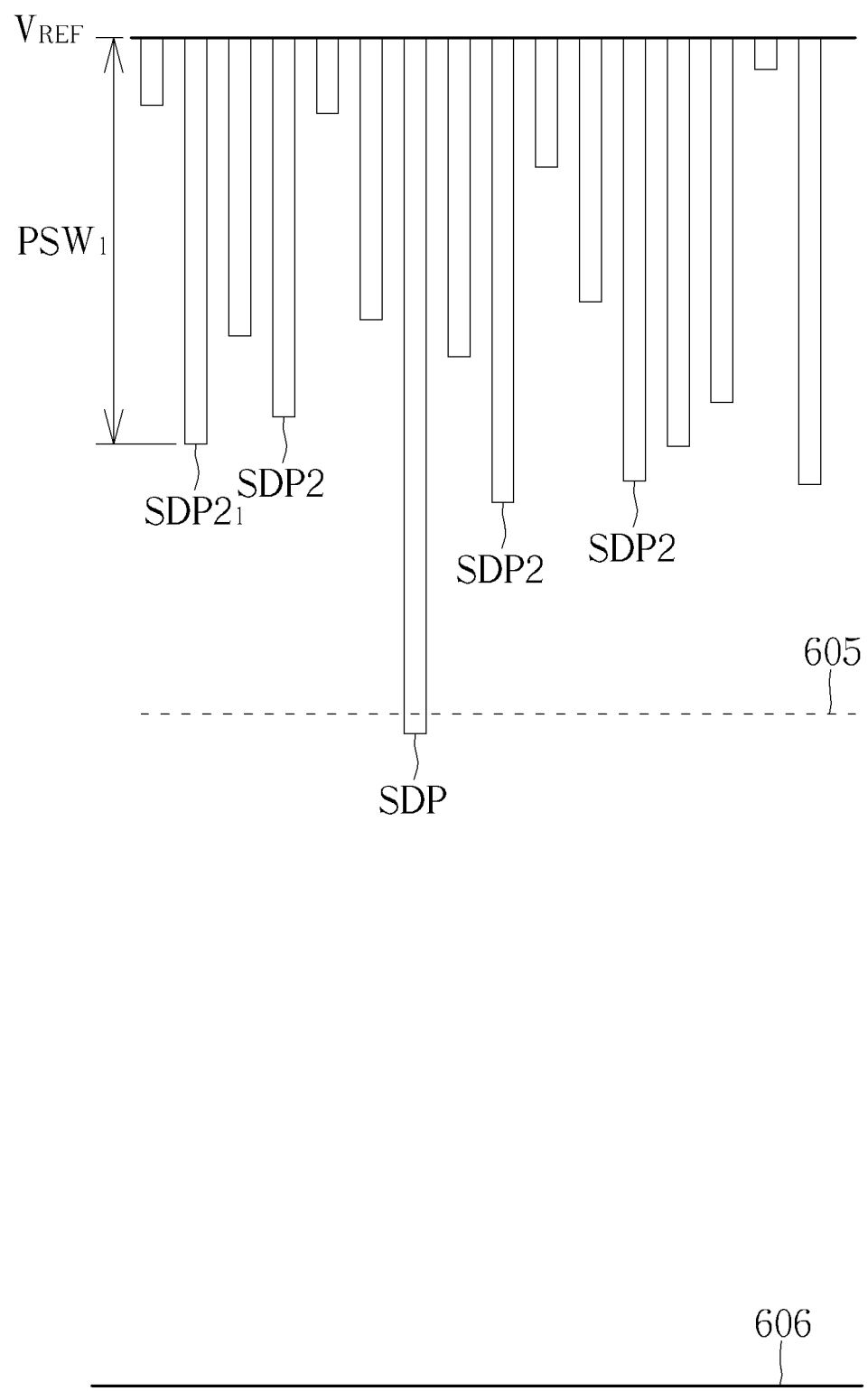
FIG. 11 illustrates a plurality of swing-deducted pulses according to an embodiment of the present application.

FIG. 10 illustrates the embodiment of the swing-deducted pulse SDP1 initiating from the envelope ENV and swinging toward the peaks PK of the boosted pulses BDP, which is not limited thereto. FIG. 11 illustrates a plurality of swing-deducted pulses SDP2, also generated by the swing deduction sub-module 6262. In the embodiment illustrated in FIG. 11, the swing deduction sub-module 6262 may generate the swing-deducted pulse $SDP2_1$, such that the swing-deducted pulse $SDP2_1$ initiates at the reference voltage $V_{REF}$ and maintains the pulse swing $PSW_1=|PK_1-ENV_1|$. In other words, the swing-deducted pulse SDP2 illustrated in FIG. 11 initiates at/from the reference voltage $V_{REF}$ and maintain the pulse swing PSW, where the pulse swing PSWi, corresponding to pulse cycle $T_{cycle,i}$, may be expressed as $PSWi=|PKi-ENVi|$. In another perspective, the swing-deducted pulses SDP2 (in FIG. 11) can be generated by shifting/translating the swing-deducted pulses SDP1 in FIG. 10 to be aligned to the reference voltage $V_{REF}$ while maintaining the pulse swing $PSWi=|PKi-ENVi|$ for each corresponding to pulse cycle $T_{cycle,i}$.

In addition, FIG. 10 and FIG. 11 also illustrate a voltage level 605 and a voltage level 606. The voltage level 606 may be corresponding to a maximum membrane displacement $U_{Z\_max}$, and the voltage level 605 may be corresponding to a middle membrane displacement $U_{Z\_mid}$, which may be a half of the maximum membrane displacement $U_{Z\_max}$, i.e., $U_{Z\_mid}=(U_{Z\_max}/2)$. In an embodiment, the reference voltage $V_{REF}$ may correspond to a zero membrane displacement $U_{Z\_0}$ voltage level (of the membrane 140) which generally corresponds to 0V being applied across electrodes 1420, 1422 (of actuator 1421). In another embodiment where actuator 1421 comprise thin-film material with permittivity varying over a wide range, the reference voltage $V_{REF}$ may correspond to a bias voltage such that, when $V_{REF}$ is applied across electrodes 1420 and 1422 (of actuator 1421), the capacitive loading of SPD 14 is at or near its lowest value, or alternatively, $V_{REF}$ may be offset slightly from the minimum permittivity bias voltage such that power consumption (of SPD 14) is lowered.

For piezoelectric actuated membrane, membrane displacement $U_Z$ is proportional to a voltage difference $\Delta V$ applied on the piezoelectric actuator (i.e., $\Delta U_Z \propto \Delta V$). When operating within a linear region of the membrane and the actuator, a stress borne by the membrane displacement may increases as the voltage difference applied on the actuator increases. By comparing FIG. 10 and FIG. 11, when $V_{REF}$ is at or near a zero displacement $U_{Z\_0}$ voltage level of membrane 140, the swing-deducted pulses and translated SDP2 in FIG. 11 would reduce the displacement $\Delta U_Z$ of membrane which cause less stress on the membrane than the swing-deducted pulses SDP1 in FIG. 10. Therefore, driving the sound producing device 14 according to the swing-deducted pulses SDP2 in FIG. 11 would improve the linearity of $\Delta U_Z$ due to reduced membrane stress and thus improve the fidelity of the sound produced. From another perspective, the reduced membrane displacement $\Delta U_Z$ also means the E-field applied to piezoelectric material 1421 is also reduced. Since the service lifetime of piezoelectric material is correlated to the E-filed strength it operates under, the reduced E-filed of SPD2 will help prolong the service lifetime of the sound producing device 14.

Driving the sound producing device 14 using the unipolar driving signal d, e.g., generated according to the boosted pulses BDP, the swing-deducted pulse SDP, SPD1 or SPD2, is called SEAM (Single Ended Amplitude Modulation) scheme. Note that, rectangular pulses were used in the illustrations of the specification mainly for the purpose clarity of discussion. Other pulse shapes can be, and should be, adopted to achieve the specific objectives of each individual embodiment of the present invention.

Figure 12:
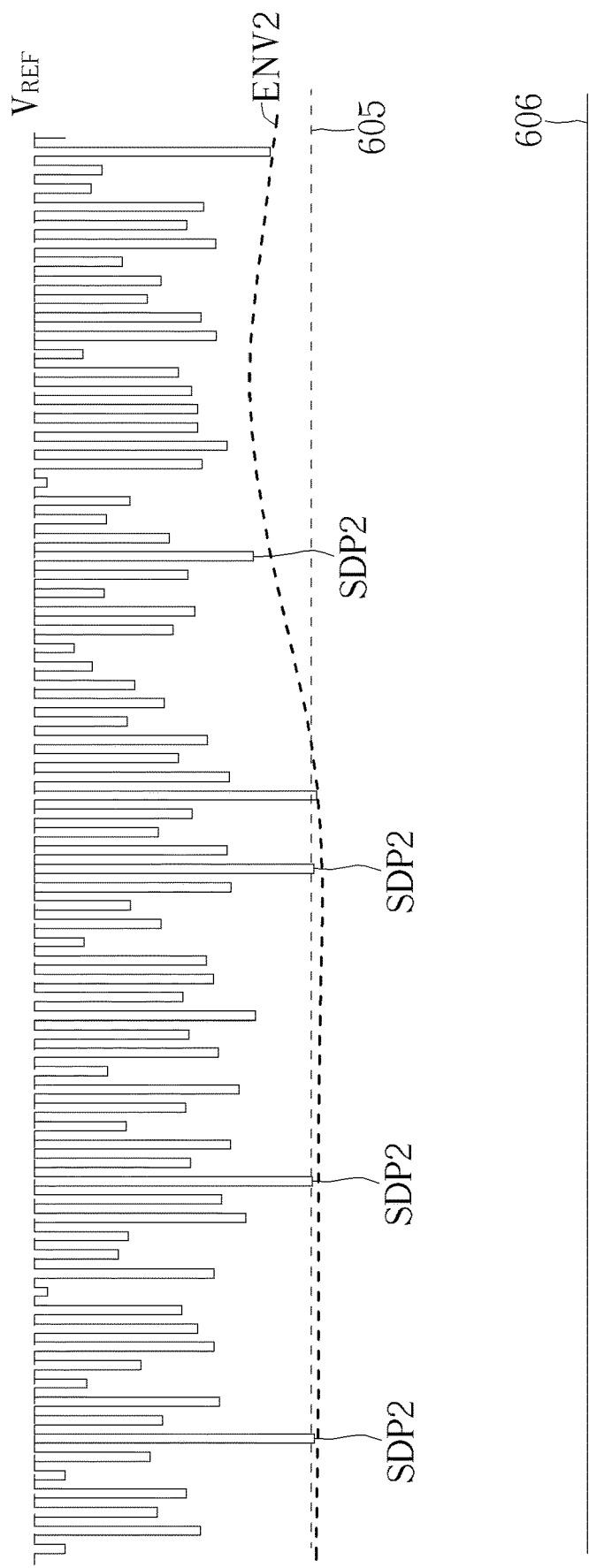
FIG. 12 illustrates a plurality of swing-deducted pulses according to an embodiment of the present application.

In another perspective, FIG. 12 provides another illustration of the swing-deducted pulses SDP2 initiating from the reference voltage $V_{REF}$, which is relative in a macro scope. The voltage levels 605 and 606 are also illustrated. Since the swing-deducted pulses SDP2 achieve (more or less) the voltage level 605 but seldom achieve the voltage level 606, a power supply for the backend power amplifier can be reduced. Analogous to the transformation from class-AB to class-H by adopting a tracking power-supply, in an embodiment, the power supply output voltage for the power amplifier can be reduced according to, or can track, an envelope ENV2 of the swing-deducted pulses SDP2 initiating from the reference voltage $V_{REF}$.

Figure 13:
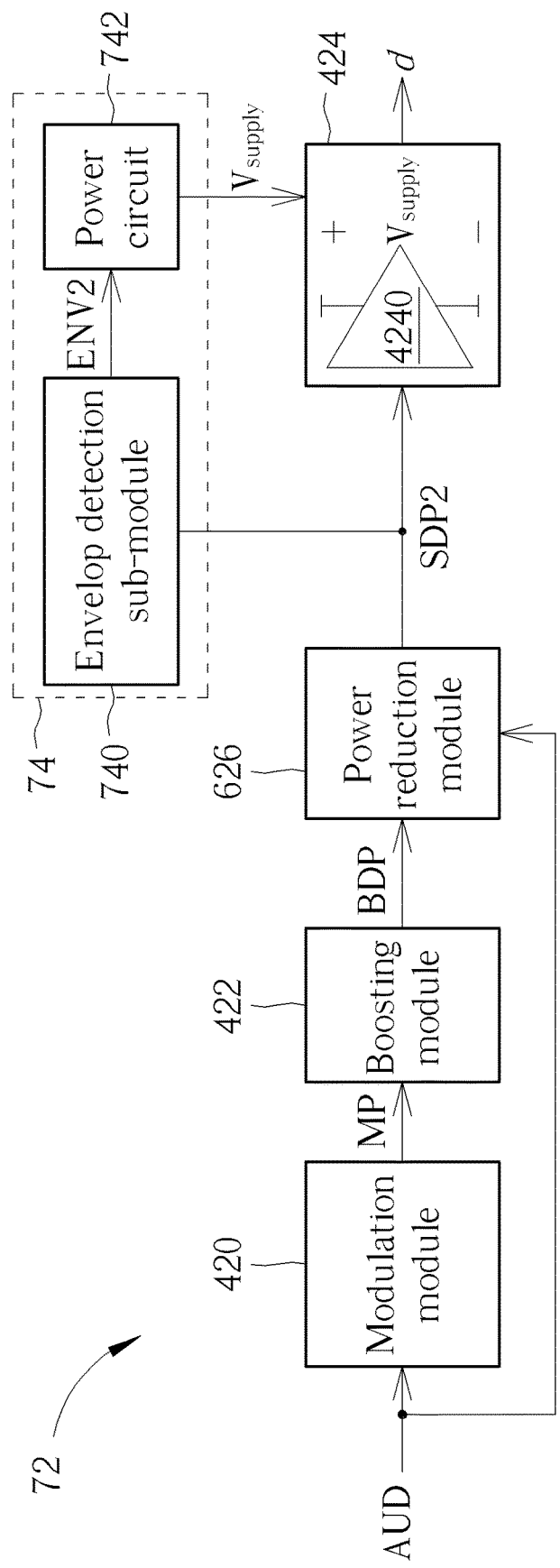
FIG. 13 is a schematic diagram of a driving circuit according to an embodiment of the present application.

FIG. 13 is a schematic diagram of a driving circuit 72 according to an embodiment of the present application. The driving circuit 72 is similar to the driving circuit 62, and thus, same components are annotated by same symbols. Different from the driving circuit 62, the driving circuit 72 further comprises an envelope detection sub-module 740. The envelope detection sub-module 740 is similar to the envelope detection sub-module 6260, which can also perform peak detection, low pass filtering and/or attack-and-release control algorithm to obtain the envelope ENV2 either according to the swing-deducted pulses SDP2, as shown in FIG. 13, or according to the input audio signal AUD directly. The envelope ENV2 may be fed to a power circuit (e.g., a DC-DC converter) 742 which provides a time varying power supply output voltage $V_{supply}$ to a power amplifier 4240 within the output stage 424. The power supply $V_{supply}$ provided for the power amplifier 4240 may follow a profile of the envelope ENV2. Therefore, a power efficiency of the power amplifier 4240 (or the driving circuit 742) is enhanced. Besides, the envelope detection sub-module 740 and the power circuit 742 may form an envelope tracking power supply module 74.

Figure 14:
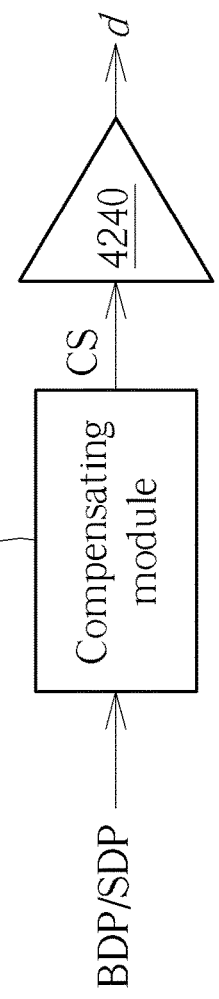
FIG. 14 is a schematic diagram of an output stage according to an embodiment of the present application.

Details of the output stage 424 are not limited. FIG. 14 is a schematic diagram of an output stage 424' according to an embodiment of the present application. The output stage 424' may be used to realize the output stage 424. The output stage 424' comprises a (linearity-) compensating module 4242 and the power amplifier 4240. The compensating module 4242 may be coupled between the boosting module 422 and the power amplifier 4240, or coupled between the power reduction module 626 and the power amplifier 4240. The compensating module 4242 receives either the boosted pulses BDP or the swing-deducted pulses SDP. The compensating module 4242 is configured to generate a compensated signal CS for the power amplifier, so as to maintain the linearity (or proportionality) between the input of the compensating module 4242, e.g., BDP or SDP, such that the power amplifier 4240 may generate the driving signal d according to the compensated signal CS. Details of the compensating module 4242 may be referred to U.S. application Ser. No. 16/695,199 filed by Applicant, which is not narrated herein for brevity.

Figure 15:
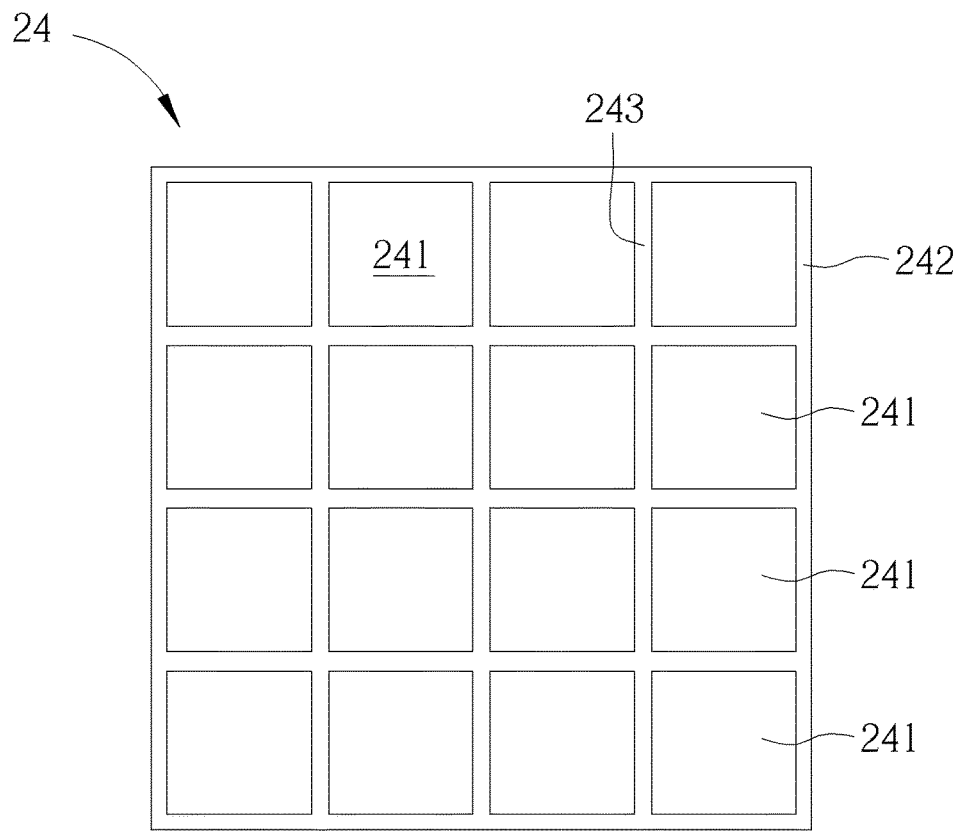
FIG. 15 illustrates a top view of a sound producing device according to an embodiment of the present application.
Figure 16:
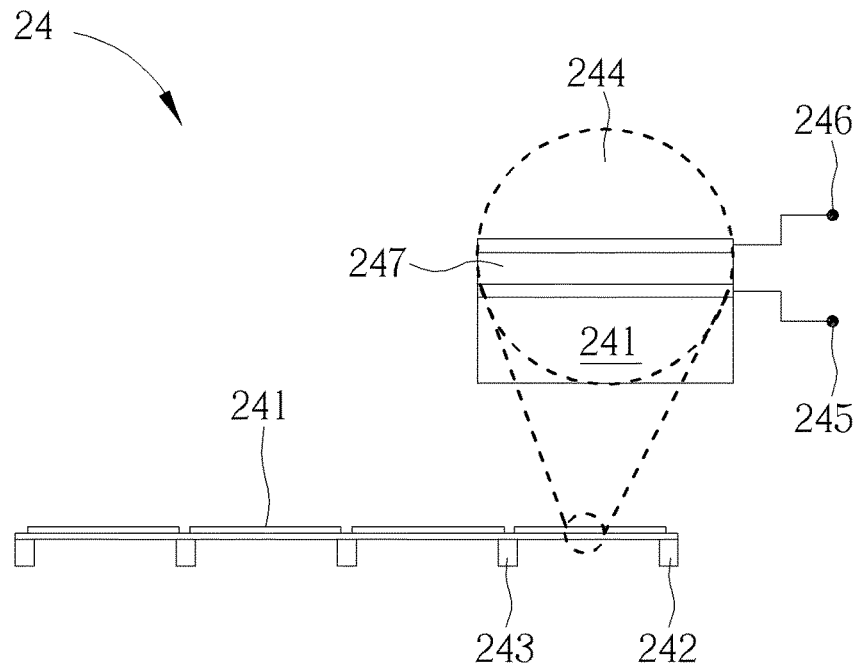
FIG. 16 illustrates a cross sectional view of the sound producing device of FIG. 15.

Alternatively, in an embodiment, the driving circuit may determine an offset value via a one-sided peak detection, and generate pulses according to the offset value. Specifically, the driving circuit may perform the one-sided peak detection on the pulse BDP/SDP to obtain a detected peak value D_peak. The driving circuit may obtain the offset value according to the detected peak value D_peak. For example, the driving circuit may compute the offset value by multiplying a difference of an initial maximum value (int_max_value) and the detected peak value D_peak by a factor α, where α may be a value between 80%~90%, for example. The driving circuit may further perform a low pass filtering process on the offset value when the offset value causes some clipping effect. Finally, the driving circuit may generate pulses with arbitrary shape with amplitudes as the input audio signal plus the (filtered) offset value. Details of the sound producing device 14 are not limited. FIG. 15 illustrates a top view of a sound producing device 24 according to an embodiment of the present application. FIG. 16 illustrates a cross sectional view of the sound producing device 24. The sound producing device 24 may be used to realize the sound producing device 14. The sound producing device 24 comprises membranes/cells 241 arranged in a P×Q array. In the embodiment illustrated in FIG. 14, P=Q=4, but not limited therein. The membrane 241 may be enclosed by either partition walls 243 or edges 242. An actuator 244 is attached/disposed on the membrane 241. Within the actuator 244, a top electrode 246 and a bottom electrode 245 sandwich an actuating material or thin film layer 247. The driving signal d is applied across the electrodes 245 and 246. The amount of membrane displacement is controlled by the voltage applied across the electrodes 245 and 246.

In an embodiment, all of the membranes 241 may be driven by the same driving signal d, but not limited thereto. In an embodiment, a "pulse-interleaving" scheme disclosed in U.S. application Ser. No. 16/420,184 may be applied. For example, the cells/membranes 241 may be grouped into N groups. The N groups of cells are preferably physically apart from each other. Each groups of cells is driven by a unipolar driving signal $d_n$ to produce a pulse array $PA_n$, i.e., the N groups of cells produce pulse arrays $PA_1, \ldots, PA_N$. The pulse arrays $PA_1, \ldots, PA_N$ may be mutually and/or temporally interleaved.

Figure 17:
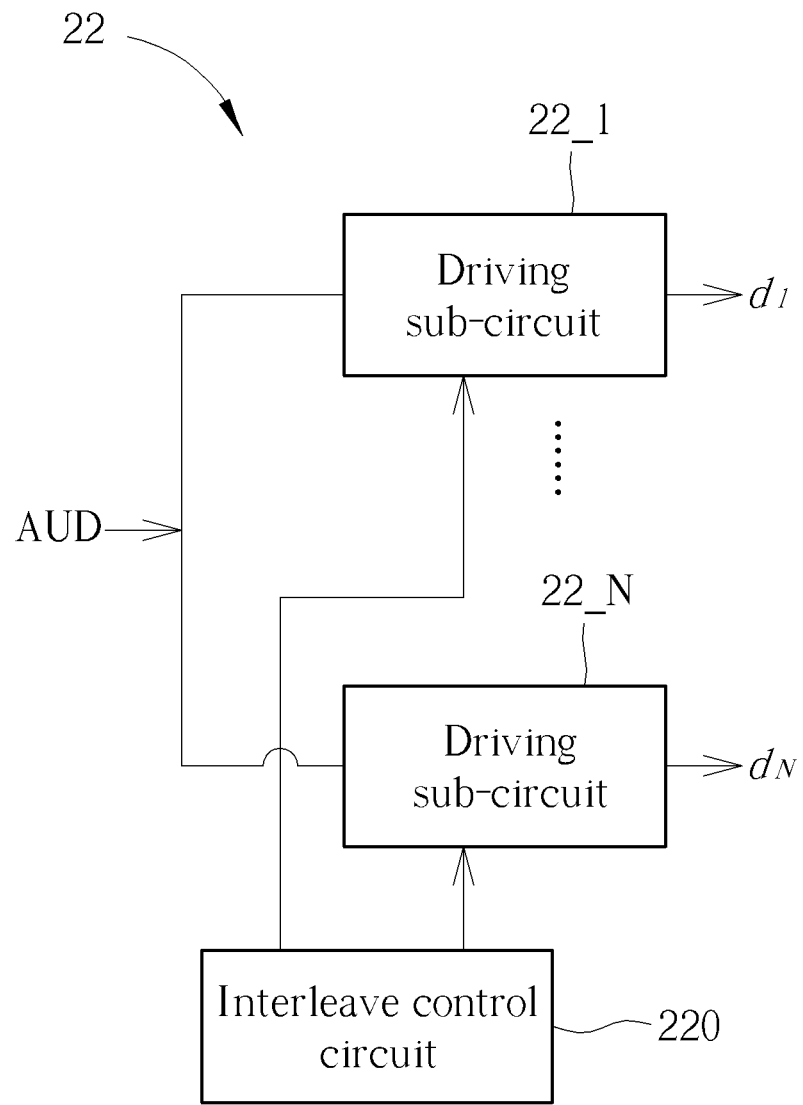
FIG. 17 illustrates a schematic diagram of a driving circuit according to an embodiment of the present application.

To realize the "pulse-interleaving" scheme, FIG. 17 illustrates a schematic diagram of a driving circuit 22 according to an embodiment of the present application. The driving circuit 22 is configured to generate unipolar SEAM driving signals $d_1, \ldots, d_N$ according to the present invention. The unipolar SEAM driving signals $d_1, \ldots, d_N$ are configured to drive the N groups of cells/membrane 241 within the sound producing device 24. The driving circuit 22 may comprise a plurality of driving sub-circuits 22_1-22_N and an interleave control circuit 220. Each driving sub-circuit 22_n may be realized by one of the driving circuits 42, 62 and 72, such that each of the driving signals $d_1, \ldots, d_N$ would be a SEAM driving signal. The interleave control circuit 220 controls the driving sub-circuits 22_1-22_N, such that the pulse arrays $PA_1, \ldots, PA_N$ driven according to SEAM driving signals $d_1, \ldots, d_N$ are temporally interleaved. Details of how the pulse arrays $PA_1, \ldots, PA_N$ are interleaved may be referred to U.S. application Ser. No. 16/420,184 filed by Applicant, which is not narrated herein for brevity.

Figure 18:
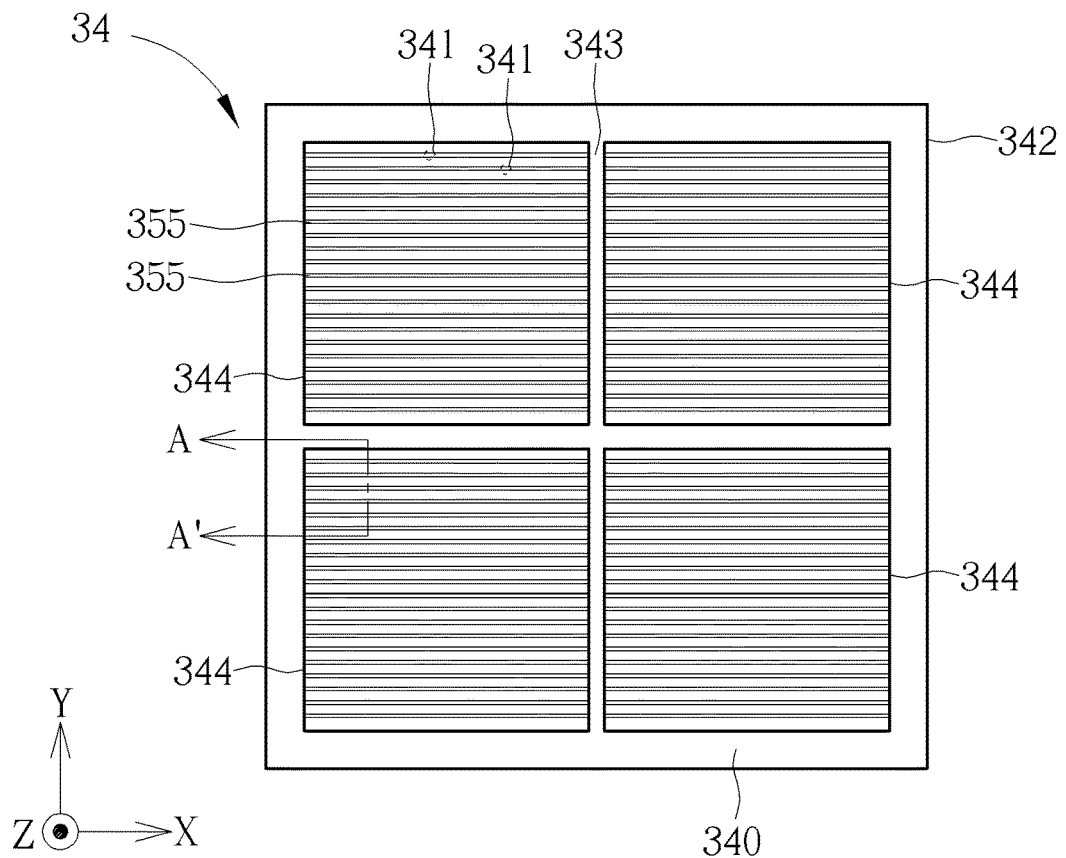
FIG. 18 illustrates a top view of a sound producing device according to an embodiment of the present application.
Figure 19:
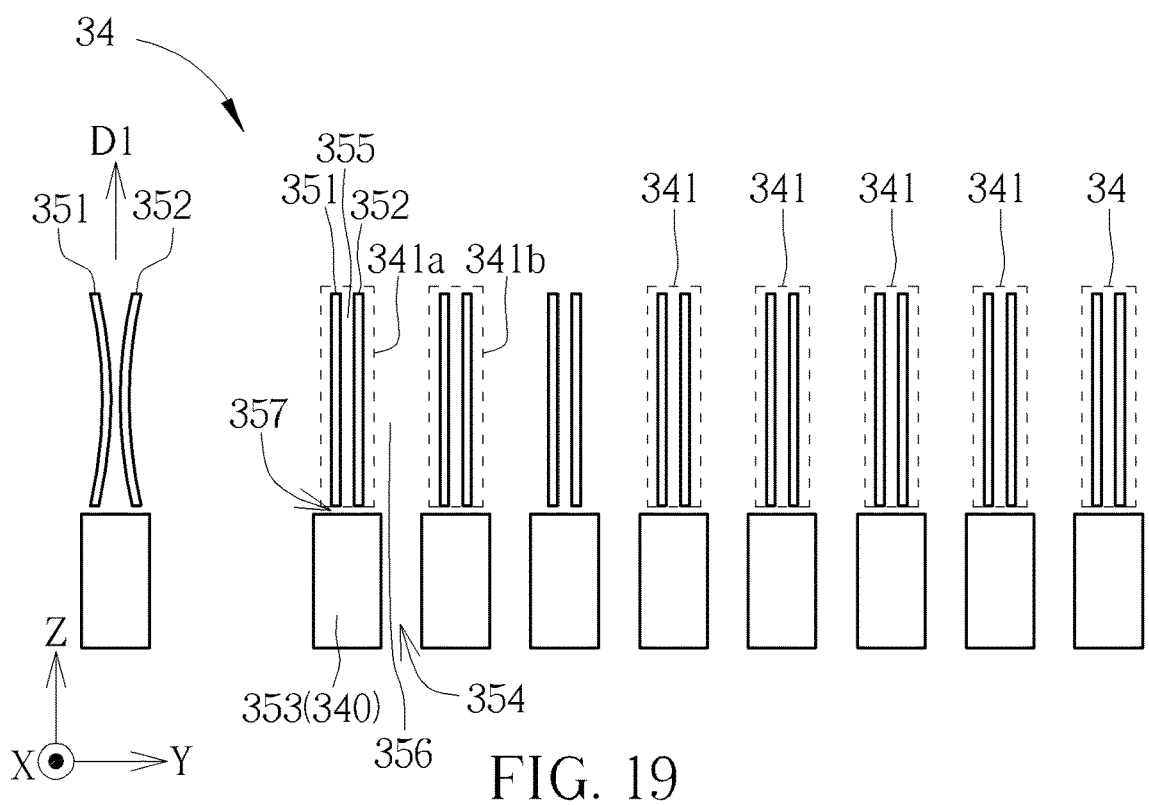
FIG. 19 illustrates a cross sectional view of the sound producing device of FIG. 15.

In another embodiment, FIG. 18 and FIG. 19 illustrate a top view and a cross sectional view of a sound producing device 34 according to an embodiment of the present application. The sound producing device 34 comprises a substrate 340 and an array of cells 344. The substrate 340 is disposed over an XY plane, a plane spanned by X-axis and Y-axis shown in FIG. 18. The array of cells 344 comprises a plurality of cells 344 arranged in an array. In the embodiment illustrated in FIG. 18, the array is a 2×2 array, but not limited thereto. Each cell 344 comprises a plurality of fin-type membrane pairs 341. The membrane pairs 341 are vertically disposed on the substrate 340. In other words, the membrane pairs 341 are perpendicular to the XY plane and parallel to the XZ plane.

FIG. 19 is a cross-section view along A-A' line of FIG. 18, where membrane pair 341 (e.g., 341a, 314b, etc.) is shown to comprise fin-type membranes 351 and 352 disposed on a base 353. The base 353 may be regarded as a part of the substrate 340. The membranes 351, 352 are perpendicular to the XY plane and parallel to the XZ plane of FIGS. 18 and 19. The membranes 351, 352 may be driven by a driving signal. The driving signal applied on the membranes 351 and 352 may, but not limited to, be the SEAM driving signal d produced by circuit 42, 62 and 72 of the present invention. When a driving voltage is applied on the membrane pair 341, the first membrane 351 and the second membrane 352 would deform toward each other, as the left portion of FIG. 19 illustrates, such that air between the first membrane 351 and the second membrane 352 is squeezed outward, and an air pulse is generated toward a (front) direction D1, which is away from the substrate 340 (or the base 353).

In an embodiment, the membranes 351 and 352 may be poly-silicon membrane, and actuated by electrostatic force through the driving signal. If the membranes 351 and 352 are poly-silicon membranes, a gap 357 may be formed to isolate the membranes 351 and 352 from each other and from substrate 353(340). In an embodiment, the membranes 351 and 352 may be actuated by NED actuator or piezoelectric actuator.

In an embodiment, one membrane (e.g., the membrane 351) may be actuated (e.g., by NED actuator) and the other (e.g., the membrane 352) may be a non-moving plate. Similarly, the air between the first membrane 351 and the second membrane 352 is squeezed outward, and an air pulse is generated toward the direction D1, which is also within the scope of the present application.

Note that, the gap 357 may not be necessary when the membrane 351/352 is made of NED construct.

In an embodiment, the membrane deformation may be along with the membranes (e.g., along the X-axis shown in FIG. 18 and FIG. 19). The air pulse generated may be toward a direction parallel to the X-axis, which is also within the scope of the present application.

Notably, when the membranes 351 and 352 deform toward each other to generate an air pressure pulse toward the (front) direction D1, inter-membrane-pair spacing 356 between two neighboring membrane pairs 341a and 341b is reduced, and thus, an anti-air-pressure-pulse is generated. The anti-air-pressure-pulse refers to an acoustic wave and its associated air movement with direction opposite to the air pressure pulsed generated by squeezing the air in an intra-membrane-pair spacing 355, e.g., the direction D1. In order to reduce a magnitude of the anti-air-pressure-pulse, an opening 354 may be formed, within the substrate 340, between neighboring membrane pairs 341a and 341b. When membrane-pairs 341a and 341b (including the membrane 352 of pair 341a and membrane 351 of pair 341b) activate, a pair of air movement are produced in the space between the membrane-pairs: one moving down from the front via the inter-membrane-pair spacing 356 and the other moving up from the back via the opening 354. Therefore, the inter-membrane-pair spacing 356 and the opening 354 would reduce the magnitude of the anti-pulse, which allows the sound producing device 34 to generate strong net air pulse in the direction D1. In an embodiment, the inter-membrane-pair spacing 356 between the membrane pairs 341a and 341b may be at least 8 times (e.g., 12 times) wider than the inter-membrane spacing 355 between the membranes 351 and 352.

Notably, in comparison to the sound producing device 24 where the air pressure pulse is generated by membrane acceleration, the sound producing device 34 generates the air pressure pulses by chamber compression, which can generate much stronger pressure pulse by utilizing the squeeze film compression effect. Note that, 1 ATM (standard atmosphere) is equivalent to 101,325 Pa (Pascal, unit of pressure) while 1 Pa=94 dB SPL, which means 2% ATM would cause an SPL of 160 dB. The 2% ATM can be produced by movement of the membrane 351 and 352 toward each other where each moves 0.01 times a width of the inter-membrane spacing 355. For example, if the inter-membrane spacing 355 is 0.75 μm (micrometer), then each of the membranes 351 and 352 moving 7.5 nm (nanometer) may produce the 2% ATM. Thus, the potential of utilizing squeeze film compression effect and generating air pulses to enhance SPL is effective.

In addition, compared to the sound producing device 24 where the SPL is proportional to the membrane area, the sound producing device 34 may achieve more area efficiency by vertically disposed the membrane pairs and the membranes, as shown in FIG. 19 which means that the sound producing device 34 may generate more SPL by occupying less area. The area efficiency would significantly reduce a size required by the sound producing device 34, suitable for being disposed in modern compact handheld and wearable electronic devices.

Note that, the membrane pairs and the membranes are not limited to be vertically disposed on the substrate. The membrane pairs and the membranes may also be obliquely disposed, which means that, the membrane pairs and the membranes may not be parallel to the substrate at the neutral state. In some embodiments, only one membrane of the membrane-pair moves while the other membrane is stationary and the gap, when implemented, may apply only to the moving membrane while the stationary membrane is connected to plate 340 without gap. In some embodiment, instead of deforming along the height direction, as shown in FIG. 19, the deformation of membrane-pair may be along the length direction of the membrane-pair.

In summary, the sound producing apparatus of the present application utilize the unipolar driving signal to driver the sound producing device, to gain better SPL performance. Further, the present application provides the sound producing device with fin-type membrane to produce air pulses by exploiting compression effect.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A sound producing apparatus (10), comprising:
   a driving circuit (12), configured to generate a driving signal according to an input audio signal; and
   a sound producing device (14);
   wherein the sound producing device is driven by the driving signal, such that the sound producing device produces a plurality of air pulses at an air pulse rate, and the air pulse rate is higher than a maximum human audible frequency;

wherein the plurality of air pulses produces a non-zero offset in terms of sound pressure level, and the non-zero offset is a deviation from a zero sound pressure level;
wherein the driving signal driving the sound producing device to produce the plurality of air pulses, is unipolar with respect to a first voltage.

2. The sound producing apparatus of claim 1, wherein the plurality of air pulses is aperiodic over a plurality of pulse cycles.

3. The sound producing apparatus of claim 1, wherein the driving circuit generates a plurality of boosted pulses according to the input audio signal, and the driving circuit generates the driving signal according to the plurality of boosted pulses, such that the driving signal is unipolar with respect to the first voltage.

4. The sound producing apparatus of claim 1, wherein the driving circuit generates a plurality of swing-deducted pulses according to the input audio signal, and the driving circuit generates the driving signal according to the plurality of swing-deducted pulses, such that the driving signal is unipolar with respect to the first voltage.

5. The sound producing apparatus of claim 4, wherein the driving circuit generates a first swing-deducted pulse, and the first swing-deducted pulse initiates at a first envelope value of an envelope of the input audio signal corresponding to a first time and reaches a peak of a first boosted pulse within a first pulse cycle, and a first pulse swing of the first swing-deducted pulse is a difference between the first envelope value and the peak of the first boosted pulse.

6. The sound producing apparatus of claim 4, wherein the driving circuit generates a first swing-deducted pulse, and the first swing-deducted pulse initiates at the first voltage, and a first pulse swing of the first swing-deducted pulse is a difference between a first envelope value of an envelope of the input audio signal corresponding to a first time and a peak of a first boosted pulse.

7. The sound producing apparatus of claim 1, wherein the driving circuit (42) comprises:
a modulation module (420), configured to generate a modulated signal according to the input audio signal, wherein the modulated signal comprises a plurality of modulated pulses; and
a boosting module (422), configured to generate a plurality of boosted pulses according to the plurality of modulated pulses;
wherein the driving circuit (42) generates the driving signal (d) according to the plurality of boosted pulses, such that the driving signal (d) is unipolar with respect to the reference voltage.

8. The sound producing apparatus of claim 7, wherein the boosting module (422) generates a plurality of boosting pulses, and adds the plurality of boosting pulses on the plurality of modulated pulses, so as to generate the plurality of boosted pulses.

9. The sound producing apparatus of claim 8, wherein the plurality of boosting pulses has a constant pulse height over a plurality of pulse cycles.

10. The sound producing apparatus of claim 7, wherein the driving circuit comprises:
a power reduction module (626), coupled to the boosting module (422), configured to generate a plurality of swing-deducted pulses according to the plurality of boosted pulses;
wherein the driving circuit generates the driving signal (d) according to the plurality of swing-deducted pulses.

11. The sound producing apparatus of claim 10, wherein the power reduction module comprises:

an envelope detection sub-module, receiving the input audio signal, configured to generate an envelope of the input audio signal; and
a swing deduction sub-module, coupled to the boosting module (622) and the envelope detection sub-module to receive the plurality of boosted pulses and the envelope of the input audio signal, configured to generate a plurality of swing-deducted pulses according to the plurality of boosted pulses and the envelope.

12. The sound producing apparatus of claim 11, wherein the envelope detection sub-module generates a first swing-deducted pulse according to a first boosted pulse and the envelope, and the first swing-deducted pulse and the first boosted pulse are corresponding to a first time.

13. The sound producing apparatus of claim 12, wherein the swing deduction sub-module generates the first swing-deducted pulse, such that the first swing-deducted pulse initiates at a first envelope value of the envelope corresponding to the first time and reaches a peak of the first boosted pulse within a first pulse cycle, and a first pulse swing of the first swing-deducted pulse is a difference between the first envelope value and the peak of the first boosted pulse.

14. The sound producing apparatus of claim 12, wherein the swing deduction sub-module generates the first swing-deducted pulse, such that the first swing-deducted pulse initiates at the first voltage, and a first pulse swing of the first swing-deducted pulse is a difference between t a first envelope value of the envelope corresponding to the first time and a peak of the first boosted pulse.

15. The sound producing apparatus of claim 1, wherein the driving circuit comprises:
a power amplifier, configured to generate the driving signal.

16. The sound producing apparatus of claim 15, wherein the driving circuit further comprises:
a compensating module, coupled to the power amplifier, configured to generate a compensated signal for the power amplifier, such that the power amplifier generates the driving signal according to the compensated signal.

17. The sound producing apparatus of claim 15, wherein the driving circuit further comprises a power supply adapting module (74), configured to provide a power supply ($V_{supply}$) for the power amplifier, and the power supply ($V_{supply}$) for the power amplifier is time varying.

18. The sound producing apparatus of claim 17, wherein the driving circuit generates a plurality of swing-deducted pulses, and the power supply adapting module generates the power supply according to an envelope of the plurality of swing-deducted pulses.

19. The sound producing apparatus of claim 17, wherein the driving circuit comprises:
an envelope detection sub-module, configured to obtain the envelope of the plurality of swing-deducted pulses; and
a power circuit, configured to generate the power supply for the power amplifier according to the envelope of the plurality of swing-deducted pulse.

20. The sound producing apparatus of claim 1, wherein the sound producing device comprises a plurality of membranes, the plurality of membranes are grouped into a plurality of groups, the driving circuit generates a plurality of driving signals, the plurality of driving signals is unipolar and configured to drive the plurality of groups, the plurality of groups produces a plurality of pulse arrays, and the plurality of pulse arrays is mutually interleaved.

21. The sound producing apparatus of claim 1, wherein the sound producing device comprises a membrane and an actuator, and the actuator is a piezoelectric actuator.

22. The sound producing apparatus of claim 1, wherein the sound producing device comprises a membrane and an actuator, and the actuator is a nanoscopic electrostatic drive (NED) actuator.

* * * * *